US011812586B2

United States Patent
Li et al.

(10) Patent No.: US 11,812,586 B2
(45) Date of Patent: Nov. 7, 2023

(54) ELECTRONIC DEVICE SYSTEM, MANUFACTURING METHOD, AND METHOD FOR CONTROLLING ELECTRONIC DEVICE SYSTEM

(71) Applicant: Huawei Technologies Co., Ltd., Shenzhen (CN)

(72) Inventors: Baosheng Li, Dongguan (CN); Tao Yan, Dongguan (CN); Xiaojing Hou, Beijing (CN); Lujun Zhou, Nanjing (CN); Liang Zhang, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 15 days.

(21) Appl. No.: 17/508,745

(22) Filed: Oct. 22, 2021

(65) Prior Publication Data

US 2022/0132703 A1 Apr. 28, 2022

(30) Foreign Application Priority Data

Oct. 26, 2020 (CN) .......................... 202011157990.1
Oct. 26, 2020 (CN) .......................... 202022414283.8

(51) Int. Cl.
*H05K 7/20* (2006.01)
(52) U.S. Cl.
CPC ..... *H05K 7/20736* (2013.01); *H05K 7/20745* (2013.01)

(58) Field of Classification Search
CPC ...................... H05K 7/20736; H05K 7/20745
See application file for complete search history.

(56) References Cited

U.S. PATENT DOCUMENTS

| 6,061,237 | A | 5/2000 | Sands et al. |
| 7,031,154 | B2* | 4/2006 | Bash ................. H05K 7/20736 236/49.5 |
| 7,518,865 | B2 | 4/2009 | Anderl et al. |
| 10,624,241 | B1* | 4/2020 | Ross ................. H05K 7/20736 |
| 2016/0029519 | A1 | 1/2016 | Chen et al. |
| 2016/0215779 | A1* | 7/2016 | Anderl ................... B23P 19/00 |

* cited by examiner

*Primary Examiner* — Mukundbhai G Patel
(74) *Attorney, Agent, or Firm* — SLATER MATSIL, LLP

(57) ABSTRACT

An electronic device system, a manufacturing method, and a method for controlling the electronic device system, in field of heat dissipation technologies. The electronic device system includes a heat source, a plurality of fans, and a plurality of air guiding apparatuses. The heat source is located on air inlet sides of the plurality of fans, and the plurality of air guiding apparatuses are located on air outlet sides of the plurality of fans. The plurality of air guiding apparatuses are configured such that, when there is a faulty fan, an air guiding direction of an air guiding apparatus corresponding to the faulty fan and an air guiding direction of an air guiding apparatus corresponding to a neighboring fan deviate from each other.

20 Claims, 8 Drawing Sheets

| Third heat source 13 | Third fan 25 | Third air guiding apparatus 34 |
|---|---|---|
| Second heat source 12 | Second fan 24 | Second air guiding apparatus 33 |
| First heat source 11 | First fan 23 | First air guiding apparatus 32 |

ELECTRONIC DEVICE SYSTEM, MANUFACTURING METHOD, AND METHOD FOR CONTROLLING ELECTRONIC DEVICE SYSTEM

CROSS-REFERENCE TO RELATED APPLICATIONS

This application claims priority to Chinese Patent Application No. 202011157990.1, filed on Oct. 26, 2020, and to Chinese Utility Model Application No. 202022414283.8, filed on Oct. 26, 2020, which are hereby incorporated by reference in its entirety.

TECHNICAL FIELD

This application relates to the field of heat dissipation technologies, and in particular, to an electronic device system, a manufacturing method, and a method for controlling the electronic device system.

BACKGROUND

An electronic device system may be a communications device system, a storage device system, a server device system, or the like, and mainly includes a heat source, a fan, and the like. For example, an electronic device system in a datacenter may include a heat source, a fan, a rack, and the like.

The heat source may be a board configured to implement functions such as communication, storage, and calculation. Both the heat source and the fan are installed in the rack. For example, the heat source is adjacent to a front door of the rack, and the fan is adjacent to a rear door of the rack. Racks are placed in rows in the datacenter, and there is a passage between two neighboring rows of racks. The datacenter has an air conditioner, so that a temperature in the passage between the racks is relatively low. The fan can suck cold air in a passage at the front door of the rack into the rack, and expel hot air into a passage at the rear door of the rack, to dissipate heat from the heat source in the rack.

However, when there is a faulty fan in the rack, hot air expelled from a normal fan adjacent to the faulty fan flows back to the rack from a location that is at the rear door of the rack and that corresponds to the faulty fan, which is not conducive to heat dissipation of the heat source in the rack.

SUMMARY

This application provides an electronic device system, a manufacturing method, and a method for controlling the electronic device system, to overcome a problem in a related technology. The technical solutions are as follows.

According to an aspect, an electronic device system is provided, and the electronic device system includes a heat source, a plurality of fans, and a plurality of air guiding apparatuses. The heat source is located on air inlet sides of the plurality of fans, and the plurality of air guiding apparatuses are located on air outlet sides of the plurality of fans. The plurality of air guiding apparatuses are configured as follows. When there is a faulty fan, an air guiding direction of an air guiding apparatus corresponding to the faulty fan and an air guiding direction of an air guiding apparatus corresponding to a neighboring fan deviate from each other.

In some examples, even if there is a faulty fan in the plurality of fans, because an air guiding direction of an air guiding apparatus corresponding to the faulty fan and an air guiding direction of an air guiding apparatus corresponding to a neighboring fan deviate from each other (for example, the air guiding direction of the air guiding apparatus corresponding to the faulty fan is inclined at positive 45 degrees to a horizontal direction, and the air guiding direction of the air guiding apparatus corresponding to the neighboring fan is inclined at negative 45 degrees to the horizontal direction), hot air expelled from the neighboring fan is guided by the air guiding apparatus corresponding to the neighboring fan to be cooled when flowing in a low temperature environment, and then air obtained after the hot air is cooled when flowing enters, through the air guiding apparatus corresponding to the faulty fan, a heat source corresponding to the faulty fan. Compared with that the hot air enters the heat source immediately after being expelled, this obviously not only does not exacerbate a high temperature of the heat source corresponding to the faulty fan, but also can dissipate heat from the heat source, thereby improving a heat dissipation effect on the heat source.

In a possible implementation, an air guiding direction of each air guiding apparatus is fixed, and air guiding directions of air guiding apparatuses of two neighboring fans deviate from each other.

During processing and manufacturing of the electronic device system, a person skilled in the art may determine air guiding directions of the air guiding apparatuses based on a quantity of air guiding apparatuses and locations of the air guiding apparatuses. Once processing and manufacturing are completed, the air guiding directions of the air guiding apparatuses corresponding to the fans are fixed and cannot be adjusted. Because air guiding directions of air guiding apparatuses corresponding to two neighboring fans deviate from each other, regardless of which fan is faulty, the following can be met, including an air guiding direction of an air guiding apparatus corresponding to the faulty fan and an air guiding direction of an air guiding apparatus corresponding to a normal fan adjacent to the faulty fan are away from each other.

In a possible implementation, an air guiding direction of each air guiding apparatus can be adjusted.

The adjustment may be manual adjustment by a user, or may be automatic adjustment.

In an example, the air guiding direction of the air guiding apparatus can be adjusted. Therefore, regardless of which fan is faulty, the following can be met, including when there is a faulty fan, an air guiding direction of an air guiding apparatus corresponding to the faulty fan and an air guiding direction of an air guiding apparatus corresponding to a neighboring fan adjacent to the faulty fan deviate from each other.

In a possible implementation, the electronic device system further includes an adjustment motor, and a control unit of the electronic device system is configured to when detecting a faulty fan, control, by using the adjustment motor, an air guiding direction of an air guiding apparatus corresponding to the faulty fan and an air guiding direction of an air guiding apparatus corresponding to a neighboring fan to deviate from each other.

In an example, the air guiding direction of each air guiding apparatus can be automatically adjusted. Therefore, when the control unit detects that a fan is faulty, for example, a first fan is faulty, the control unit may adjust an air guiding direction of a first air guiding apparatus corresponding to the first fan and an air guiding direction of a second air guiding apparatus corresponding to a second fan adjacent to the first fan, so that the air guiding direction of the first air guiding apparatus and the air guiding direction of the second air guiding apparatus are away from each other.

It can be learned that the air guiding direction of the air guiding apparatus can be automatically adjusted by using the control unit and the adjustment motor. Therefore, regardless of which fan is faulty, the following can be met, including an air guiding direction of an air guiding apparatus corresponding to the faulty fan and an air guiding direction of an air guiding apparatus corresponding to a normal fan adjacent to the faulty fan are away from each other.

In a possible implementation, the control unit is specifically configured to when detecting the faulty fan, determine a target angle based on a lowest temperature of a heat source corresponding to the faulty fan, and control, by using the adjustment motor, the air guiding direction of the air guiding apparatus corresponding to the faulty fan and the air guiding direction of the air guiding apparatus corresponding to the neighboring fan to deviate from each other based on the target angle.

In an example, the control unit may pre-store a plurality of deviation angles, then select one of the plurality of deviation angles as the target angle based on a heat dissipation condition of a first heat source corresponding to the first fan, and further control, by using the adjustment motor, the air guiding direction of the air guiding apparatus corresponding to the faulty fan and the air guiding direction of the air guiding apparatus corresponding to the neighboring fan to deviate from each other based on the selected target angle.

In this way, when there is a faulty fan, an angle by which an air guiding direction of an air guiding apparatus corresponding to the faulty fan and an air guiding direction of an air guiding apparatus corresponding to a neighboring fan deviate from each other is adjusted and controlled based on a heat dissipation condition of a heat source corresponding to the faulty fan and heat dissipation optimization, thereby improving heat dissipation effect on the heat source.

In a possible implementation, the air guiding apparatuses include a first air guiding apparatus and a second air guiding apparatus. When there is a faulty fan, an air guiding direction of the first air guiding apparatus is inclined at negative $\alpha$ degrees to a horizontal direction, and an air guiding direction of the second air guiding apparatus is inclined at positive $\beta$ degrees to the horizontal direction, where both $\alpha$ and $\beta$ are values ranging from 15 to 30.

In a possible implementation, the air guiding apparatuses include a first air guiding apparatus, a second air guiding apparatus, and a third air guiding apparatus. The second air guiding apparatus is located between the first air guiding apparatus and the third air guiding apparatus. When there is a faulty fan, an air guiding direction of the first air guiding apparatus is inclined at negative $\alpha$ degrees to a horizontal direction, an air guiding direction of the second air guiding apparatus is parallel to the horizontal direction, and an air guiding direction of the third air guiding apparatus is inclined at positive $\beta$ degrees to the horizontal direction, where both $\alpha$ and $\beta$ are values ranging from 30 to 60.

In a possible implementation, the air guiding apparatuses include a first air guiding apparatus, a second air guiding apparatus, a third air guiding apparatus, and a fourth air guiding apparatus. The first air guiding apparatus, the second air guiding apparatus, the third air guiding apparatus, and the fourth air guiding apparatus are sequentially arranged adjacent to each other. When there is a faulty fan, an air guiding direction of the first air guiding apparatus is inclined at negative $\alpha$ degrees to a horizontal direction, and an air guiding direction of the second air guiding apparatus is inclined at negative $\beta$ degrees to the horizontal direction, where $\alpha$ is a value ranging from 45 to 60, and $\beta$ is a value ranging from 15 to 30, and an air guiding direction of the third air guiding apparatus is inclined at positive $\gamma$ degrees to the horizontal direction, and an air guiding direction of the fourth air guiding apparatus is inclined at positive $\delta$ degrees to the horizontal direction, where $\gamma$ is a value ranging from 15 to 30, and $\delta$ is a value ranging from 45 to 60.

In this way, regardless of which fan is faulty, that is, regardless of a specific air guiding apparatus whose corresponding fan is faulty, the following can be met, including an air guiding direction of the air guiding apparatus corresponding to the faulty fan and an air guiding direction of an air guiding apparatus corresponding to a neighboring fan adjacent to the faulty fan deviate from each other.

In a possible implementation, the plurality of air guiding apparatuses are fastened on outer surfaces of housings of the plurality of fans.

In an example, the air inlet side of the fan may be fastened on a rear end face of the heat source, the air guiding apparatus may be fastened on the air outlet side of the fan, and the fan is located between the heat source and the air guiding apparatus. Both a front panel and the rear end face of the heat source have perforated plates for ventilation and heat dissipation. In this way, during working, the fan can suck cold air on the front panel of the heat source into the heat source, and the cold air flows in the heat source to dissipate heat from the heat source. Then the cold air enters the fan from the rear end face of the heat source, and is expelled from the air outlet side of the fan, and is expelled, through an air deflector of the air guiding apparatus, into a low temperature environment in which the electronic device system is located.

In a possible implementation, the electronic device system further includes a cabinet, both the heat source and the plurality of fans are fastened to the cabinet, and the plurality of air guiding apparatuses are fastened on an outer surface of a wall of the cabinet.

In an example, the air outlet side of the fan is adjacent to or even attached to an inner surface of the wall of the cabinet, and the air guiding apparatus is fastened on the outer surface of the wall of the cabinet, for example, the air guiding apparatus is fastened on an outer surface of a bottom of a slot of the cabinet. A specific installation location of the air guiding apparatus is not limited in this embodiment, provided that the air guiding apparatus is located on the air outlet side of the fan, so that hot air expelled from the fan is expelled out of the electronic device system through the air guiding apparatus.

The air guiding apparatus is fastened on the outer surface of the wall of the cabinet, and the air guiding apparatus occupies no space inside the wall of the cabinet, so that without an increase in a size of the wall of the cabinet, the air guiding apparatus can guide away hot air expelled from the fan, thereby facilitating heat dissipation inside the wall of the cabinet.

In a possible implementation, the electronic device system further includes a cabinet and a rack, both the heat source and the plurality of fans are fastened to the cabinet, the cabinet is fastened to the rack, and the plurality of air guiding apparatuses are all fastened on an outer surface of a door of the rack.

In an example, the air outlet side of the fan is adjacent to or even attached to an inner surface of a wall of the cabinet, the wall of the cabinet is adjacent to or even attached to an inner surface of a rear door of the rack, and the air guiding apparatus is fastened on an outer surface of the rear door of the rack. A specific installation location of the air guiding apparatus is not limited in this embodiment, provided that the air guiding apparatus is located on the air outlet side of the fan, so that hot air expelled from the fan is expelled out of the electronic device system through the air guiding apparatus.

The air guiding apparatus is fastened on the outer surface of the door of the rack, and the air guiding apparatus occupies no space inside the rack, so that without an increase in a size of the rack, the air guiding apparatus can guide away hot air expelled from the fan, thereby facilitating heat dissipation inside the rack.

In a possible implementation, each air guiding apparatus includes a plurality of air deflectors, and a plurality of air deflectors belonging to a same air guiding apparatus have a same air guiding direction.

In an example, the air guiding apparatus may be any part that has an air guiding function, for example, may be an air deflector. A plurality of air deflectors belonging to a same air guiding apparatus have a same air guiding direction. The air guiding direction of the air deflector is an air guiding direction of the air guiding apparatus to which the air deflector belongs, and the air guiding direction is a flowing direction of air expelled from the air deflector of the air guiding apparatus.

For example, air guiding directions of air deflectors of the air guiding apparatuses all face to a same direction, for example, are all inclined at positive 45 degrees to a horizontal direction, or all are inclined at negative 45 degrees to the horizontal direction, or are all parallel to the horizontal direction.

According to another aspect, a method for manufacturing an electronic device system is further provided, including installing a heat source, a plurality of fans, and a plurality of air guiding apparatuses. The heat source is located on air inlet sides of the plurality of fans, and the plurality of air guiding apparatuses are located on air outlet sides of the plurality of fans. The plurality of air guiding apparatuses are configured as follows. When there is a faulty fan, an air guiding direction of an air guiding apparatus corresponding to the faulty fan and an air guiding direction of an air guiding apparatus corresponding to a neighboring fan deviate from each other.

In an example, the air inlet sides of the plurality of fans may be installed on a rear end face of the heat source. The fan and the heat source may be in a fastening relationship, or may not be in a fastening relationship. This is not limited in this embodiment, provided that the air inlet side of the fan is attached to the rear end face of the heat source.

The plurality of air guiding apparatuses may be installed on the air outlet sides of the plurality of fans. The air guiding apparatus and the fan may be in a fastening relationship, or may not be in a fastening relationship. This is not limited in this embodiment, provided that the air guiding apparatus is relatively close to the air outlet side of the fan. The air guiding apparatus may be attached to or approximately attached to the air outlet side of the fan.

When there is a faulty fan, an air guiding direction of an air guiding apparatus corresponding to the faulty fan and an air guiding direction of an air guiding apparatus corresponding to a neighboring fan deviate from each other.

In this way, when there is a faulty fan, hot air expelled from a neighboring fan adjacent to the faulty fan is guided by a corresponding air guiding apparatus to be cooled when flowing in a low temperature environment, and then cooled air enters the electronic device system through an air guiding apparatus corresponding to the faulty fan, so that not only a high temperature inside the electronic device system is not exacerbated, but also heat can be dissipated from the heat source, thereby facilitating heat dissipation of the heat source.

In a possible implementation, the installing a heat source, a plurality of fans, and a plurality of air guiding apparatuses includes installing the heat source and the plurality of fans, and installing the plurality of air guiding apparatuses on outer surfaces of housings of the plurality of fans.

In an example, each air guiding apparatus may be fastened on an outer surface of a housing of a fan corresponding to the air guiding apparatus, and the air guiding apparatus is located on an air outlet side of the fan corresponding to the air guiding apparatus.

In a possible implementation, the electronic device system further includes a cabinet, and the installing a heat source, a plurality of fans, and a plurality of air guiding apparatuses includes installing the heat source and the plurality of fans in the cabinet, and installing the plurality of air guiding apparatuses on an outer surface of a wall of the cabinet.

In an example, the cabinet has a slot, and the heat source and the plurality of fans may be installed in the slot. A front panel of the heat source is located at an opening of the slot, the fan is located at a bottom of the slot, and the air inlet side of the fan is adjacent to or even attached to the rear end face of the heat source. When the plurality of fans and the plurality of air guiding apparatuses are installed, the plurality of air guiding apparatuses may be installed on the outer surface of the wall of the cabinet. For example, the air guiding apparatus may be fastened on an outer surface of the bottom of the slot of the cabinet.

In this way, the air guiding apparatus is installed on the outer surface of the wall of the cabinet, and occupies no space inside the cabinet, so that installation space of the cabinet can be saved.

In a possible implementation, the electronic device system further includes a cabinet and a rack, and the installing a heat source, a plurality of fans, and a plurality of air guiding apparatuses includes installing the heat source and the plurality of fans in the cabinet, installing the cabinet in the rack, and installing the plurality of air guiding apparatuses on an outer surface of a door of the rack.

In an example, when the heat source and the plurality of fans are installed, the heat source and the plurality of fans may be installed in the cabinet, and the cabinet is installed in the rack. For a process of installing the heat source and the plurality of fans in the cabinet, reference may be made to the foregoing description. A plurality of cabinets installed with the heat source and the plurality of fans can be piled together and installed in the rack. A front panel of the heat source is located at one door of the rack, and the air outlet side of the fan is located at the other door of the rack. For example, the front panel of the heat source is located at a front door of the rack, and the air outlet side of the fan is located at a rear door of the rack. When the plurality of fans and the plurality of air guiding apparatuses are installed, the plurality of air guiding apparatuses may be installed on the outer surface of the door of the rack. For example, the plurality of air guiding apparatuses are fastened on an outer surface of the rear door of the rack.

In this way, the air guiding apparatus is installed on the outer surface of the door of the rack, and occupies no space inside the rack, so that installation space of the rack can be saved.

According to another aspect, a method for controlling an electronic device system is further provided, and is applied to any one of the electronic device systems. An air guiding direction of an air guiding apparatus in the electronic device system can be adjusted. The method may include controlling, when detecting a faulty fan, an air guiding direction of an air guiding apparatus corresponding to the faulty fan and an air guiding direction of an air guiding apparatus corresponding to a neighboring fan to deviate from each other.

In an example, the air guiding direction of the air guiding apparatus can be adjusted. Therefore, regardless of which fan is faulty, the following can be met, including when there is a faulty fan, an air guiding direction of an air guiding apparatus corresponding to the faulty fan and an air guiding direction of an air guiding apparatus corresponding to a neighboring fan adjacent to the faulty fan deviate from each other.

In a possible implementation, the controlling, when detecting a faulty fan, an air guiding direction of an air guiding apparatus corresponding to the faulty fan and an air guiding direction of an air guiding apparatus corresponding to a neighboring fan to deviate from each other includes when detecting the faulty fan, determining a target angle based on a lowest temperature of a heat source corresponding to the faulty fan, and controlling the air guiding direction of the air guiding apparatus corresponding to the faulty fan and the air guiding direction of the air guiding apparatus corresponding to the neighboring fan to deviate from each other based on the target angle.

In this way, when there is a faulty fan, an angle by which an air guiding direction of an air guiding apparatus corresponding to the faulty fan and an air guiding direction of an air guiding apparatus corresponding to a neighboring fan deviate from each other is adjusted and controlled based on a heat dissipation condition of a heat source corresponding to the faulty fan and heat dissipation optimization, thereby improving heat dissipation effect on the heat source.

In the embodiments of this application, the electronic device system includes the heat source, the fan, and the air guiding apparatus. The heat source is located on the air inlet side of the fan, and the air guiding apparatus is located on the air outlet side of the fan. When there is a faulty fan, an air guiding direction of an air guiding apparatus corresponding to the faulty fan and an air guiding direction of an air guiding apparatus corresponding to a neighboring fan deviate from each other. In this way, even if there is a faulty fan, hot air expelled from a neighboring fan adjacent to the faulty fan is guided by an air guiding apparatus corresponding to the neighboring fan to be cooled when flowing in a low temperature environment, and then cooled air enters the electronic device system through an air guiding apparatus corresponding to the faulty fan, so that not only a high temperature inside the electronic device system is not exacerbated, but also heat can be dissipated from the heat source, thereby facilitating heat dissipation of the heat source.

REFERENCE NUMERALS

1. Heat source; 11. First heat source; 12. Second heat source; and 13. Third heat source;
2. Fan; 21. Air inlet side; 22. Air outlet side; 23. First fan; 24. Second fan; and 25. Third fan;
3. Air guiding apparatus; 31. Air deflector; 32. First air guiding apparatus; 33. Second air guiding apparatus; 34. Third air guiding apparatus; and 35. Fourth air guiding apparatus; and
4. Adjustment motor; 5. Cabinet; and 6. Rack.

DETAILED DESCRIPTION OF ILLUSTRATIVE EMBODIMENTS

The embodiments of this application provide an electronic device system. The electronic device system may be a communications device system, may be a storage device system, or may be a server device system. A specific form of the electronic device system is not limited in the embodiments.

In a scenario of the electronic device system, the electronic device system is located in a low temperature environment, for example, located in a datacenter having a refrigerating air conditioner. The electronic device system has a fan. The fan may also be referred to as an exhaust fan. The fan can suck cold air in the environment into the electronic device system to dissipate heat from a heat source inside the electronic device system, and expel hot air into the environment. The hot air expelled into the environment and the cold air in the environment are merged to cool the datacenter by using the air conditioner in the datacenter, so that the environment maintains a low temperature state.

Figure 1:
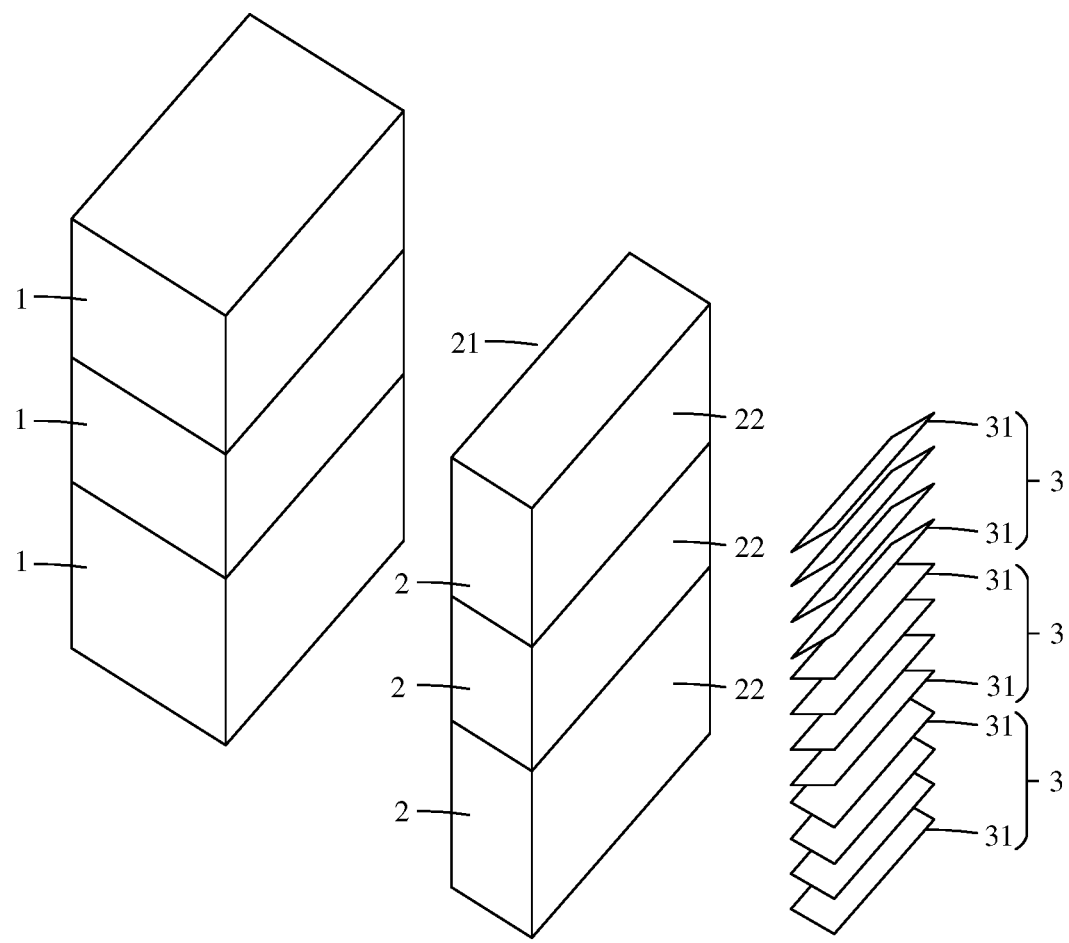
FIG. 1 is a schematic exploded structural diagram of an electronic device system according to this application.

As shown in a schematic exploded diagram of the electronic device system in FIG. 1, the electronic device system may include a heat source 1, a plurality of fans 2, and a plurality of air guiding apparatuses 3. As shown in a schematic structural diagram of the electronic device system obtained after assembly in FIG. 2, the heat source 1 is located on air inlet sides 21 of the plurality of fans 2, and the plurality of air guiding apparatuses 3 are located on air outlet sides 22 of the plurality of fans 2. The plurality of air guiding apparatuses 3 are configured as follows. When there is a faulty fan, an air guiding direction of an air guiding apparatus 3 corresponding to the faulty fan and an air guiding direction of an air guiding apparatus 3 corresponding to a neighboring fan deviate from each other.

The heat source 1 may be a part that generates heat during working, for example, may be an electronic device, may be a board, or may be a function module of an electronic device. This is not limited in this embodiment.

In an example, the fan 2 may be an exhaust fan located on one side of the heat source 1, and is configured to suck air on an opposite side of the heat source 1 into the heat source 1. After flowing through the heat source 1, the air is expelled from a side that is of the heat source 1 and that is close to the fan 2. Expelled hot air is cooled in an environment in which the electronic device system is located. For example, a first side of the heat source 1 and the air inlet side 21 of the fan 2 are close to each other. The fan 2 can suck air on a second side of the heat source 1 into the heat source 1. After flowing through the heat source 1, the air enters the fan 2 from the first side of the heat source 1, and is expelled from the air outlet side 22 of the fan 2. Expelled hot air is cooled in an environment in which the electronic device system is located.

Figure 2:
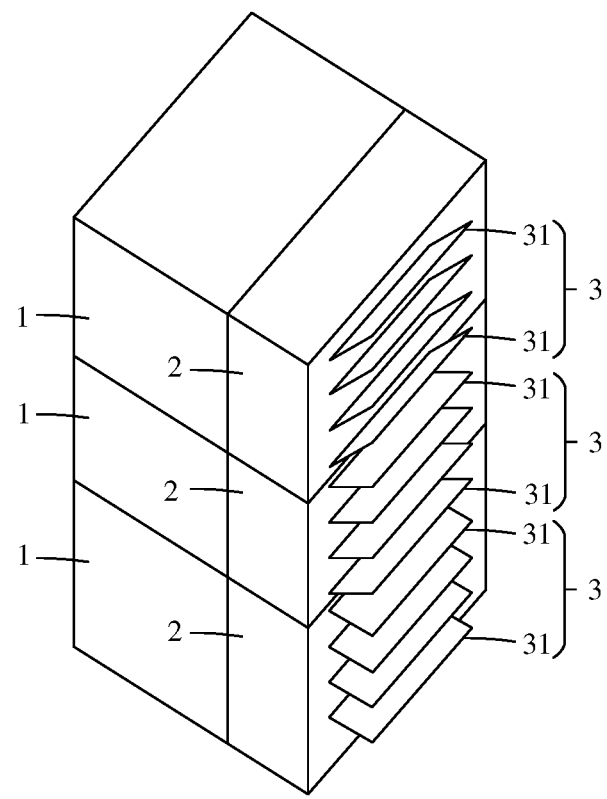
FIG. 2 is a schematic structural diagram of an electronic device system obtained after assembly according to this application.

There may be one or more heat sources 1 in the electronic device system. For example, there is one heat source 1, and the heat source 1 generates relatively high heat during working. In this case, a plurality of fans 2 are used to dissipate the heat from the heat source 1. For another example, there are a plurality of heat sources 1, as shown in FIG. 2. In one case, a quantity of the heat sources 1 is the same as a quantity of fans 2, the heat source 1 and the fan 2 are in a one-to-one correspondence, and one fan 2 is used to dissipate heat from one heat source 1. In another case, a quantity of heat sources 1 is different from a quantity of fans 2, and a plurality of heat sources 1 share one fan 2 for heat dissipation, or a plurality of fans 2 are used to dissipate heat from one heat source 1.

A correspondence between the heat source 1 and the fan 2 is not limited in this embodiment, and a person skilled in the art may flexibly select a correspondence based on heat actually generated by the heat source 1. For ease of description, that the heat source 1 and the fan 2 are in a one-to-one correspondence may be used as an example in the following.

In an example, a location relationship between a plurality of heat sources 1 may be as follows. The heat sources 1 are vertically stacked up or are horizontally placed side by side. Because the air inlet side 21 of the fan 2 is adjacent to one side of the heat source 1, if the plurality of heat sources 1 are vertically stacked up, the plurality of fans 2 are also vertically stacked up, or if the plurality of heat sources 1 are horizontally placed side by side, the plurality of fans 2 are also horizontally placed side by side. The location relationship between the plurality of heat sources 1 and a location relationship between the plurality of fans 2 are not limited in this embodiment, and a person skilled in the art may flexibly select a location relationship based on an actual situation. For ease of description, that the plurality of heat sources 1 are vertically stacked up and the plurality of fans 2 are vertically stacked up may be used as an example, as shown in FIG. 2.

Because the fan 2 is configured to dissipate heat from the heat source 1, correspondingly, the heat source 1 is located on the air inlet side 21 of the fan 2. For example, the heat source 1 may be a board, a panel of the heat source 1 may be referred to as a front panel (for example, may be the second side of the heat source 1 described above), and an opposite side of the panel is referred to as a rear end face (for example, may be the first side of the heat source 1 described above). In this case, the rear end face of the heat source 1 is attached to the air inlet side 21 of the fan 2. Both the front panel and the rear end face of the heat source 1 have perforated plates. The fan 2 can suck cold air on the front panel of the heat source 1 into the heat source 1. After flowing through a heat dissipation channel inside the heat source 1, the cold air is expelled through the perforated plate on the rear end face of the heat source 1 and the air outlet side 22 of the fan 2, to dissipate heat from the heat source 1.

The air inlet side 21 of the fan 2 may be an air inlet of the fan 2, and the air outlet side 22 of the fan 2 may be an air outlet of the fan 2.

A perforated plate for air entry, an air inlet for air entry, or the like may be disposed on the front panel of the heat source 1, or an interface on the front panel of the heat source 1 may be used as an air inlet. Similarly, a perforated plate for air exhaust, an air outlet for air exhaust, or the like may be disposed on the rear end face of the heat source 1. This is not limited in this embodiment.

Figure 3:
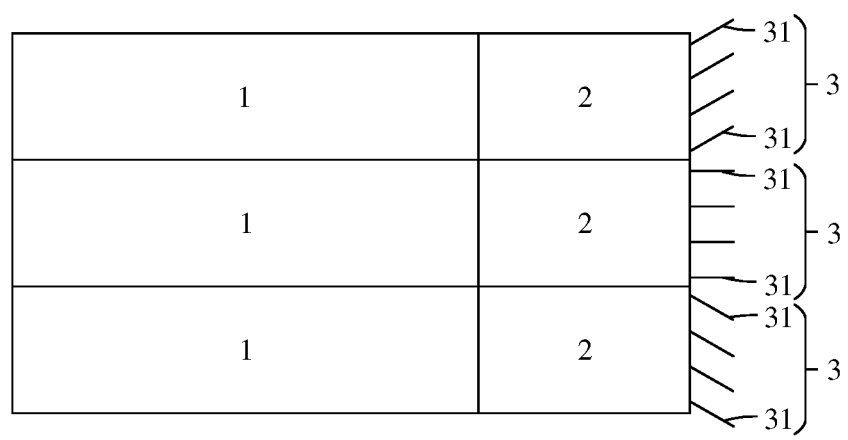
FIG. 3 is a schematic structural diagram of an electronic device system according to this application.

In an example, because the air guiding apparatus 3 is configured to guide hot air expelled from the fan 2 away from the electronic device system, correspondingly, in terms of location relationship between the fan 2 and the air guiding apparatus 3, the air guiding apparatus 3 may be located on the air outlet side 22 of the fan 2. For example, an end that is of the air guiding apparatus 3 and that is in an air guiding direction is attached to the air outlet side 22 of the fan 2. In terms of quantity, as shown in FIG. 3, a quantity of air guiding apparatuses 3 may be equal to a quantity of fans 2, and the air guiding apparatus 3 and the fan 2 are in a one-to-one correspondence. Alternatively, a quantity of air guiding apparatuses 3 is greater than a quantity of fans 2, and one fan 2 corresponds to a plurality of air guiding apparatuses 3. For example, two air guiding apparatuses 3 are installed on the air outlet side 22 of one fan 2. A correspondence between the air guiding apparatus 3 and the fan 2 is not limited in this embodiment. A person skilled in the art may flexibly set a corresponding quantity of air guiding apparatuses 3 based on a volume of the fan 2. For ease of understanding, that the fan 2 and the air guiding apparatus 3 are in a one-to-one correspondence may be used as an example in the accompanying drawings.

The air guiding apparatus 3 may be any part that has an air guiding function.

For example, as shown in FIG. 1, the air guiding apparatus 3 may include a plurality of air deflectors 31. As shown in FIG. 2, refer to FIG. 3. A plurality of air deflectors 31 belonging to a same air guiding apparatus 3 have a same air guiding direction. The air guiding direction of the air deflector 31 is an air guiding direction of the air guiding apparatus 3 to which the air deflector 31 belongs, and the air guiding direction is a flowing direction of air expelled from the air deflector 31 of the air guiding apparatus 3.

For example, as shown in FIG. 2, air guiding directions of air deflectors 31 of the air guiding apparatuses 3 all face to a same direction, for example, are all inclined at positive 45 degrees to a horizontal direction, or are all inclined at negative 45 degrees to the horizontal direction, or are all parallel to the horizontal direction.

For "positive" or "negative" of an angle, unless specifically described in the following, an angle rotated counterclockwise relative to the horizontal direction is positive, and an angle rotated clockwise relative to the horizontal direction is negative.

To prevent hot air expelled from a neighboring fan adjacent to a faulty fan from directly entering the faulty fan to exacerbate a high temperature of a heat source 1 corresponding to the faulty fan, correspondingly, when there is a faulty fan, an air guiding direction of an air guiding apparatus 3 corresponding to the faulty fan and an air guiding direction of an air guiding apparatus 3 corresponding to a neighboring fan adjacent to the faulty fan deviate from each other.

The faulty fan is any fan 2 in the plurality of fans 2, and the neighboring fan is a fan 2 adjacent to the faulty fan. Unless specifically described in the following, the faulty fan corresponds to the neighboring fan, and the neighboring fan is the fan adjacent to the faulty fan.

In an example, "deviate from each other" may also be referred to as "away from each other". That air guiding directions of two air guiding apparatuses 3 deviate from each other also means air expelled from air deflectors 31 of the two air guiding apparatuses 3 do not converge on the air outlet side 22, and flows in directions deviating from each other. For example, air expelled from an air deflector 31 of an air guiding apparatus 3 corresponding to a faulty fan flows towards a direction that is inclined at positive 45 degrees to the horizontal direction, and air expelled from an air deflector 31 of an air guiding apparatus 3 corresponding to a neighboring fan flows towards a direction that is inclined at negative 45 degrees to the horizontal direction.

In this way, even if there is a faulty fan in the plurality of fans 2, because an air guiding direction of an air guiding apparatus 3 corresponding to the faulty fan and an air guiding direction of an air guiding apparatus 3 corresponding to a neighboring fan deviate from each other (for example, the air guiding direction of the air guiding apparatus 3 corresponding to the faulty fan is inclined at positive 45 degrees to a horizontal direction, and the air guiding direction of the air guiding apparatus 3 corresponding to the neighboring fan is inclined at negative 45 degrees to the horizontal direction), hot air expelled from the neighboring fan is guided by the air guiding apparatus 3 corresponding to the neighboring fan to be cooled when flowing in a low temperature environment, and then air obtained after the hot air is cooled when flowing enters, through the air guiding apparatus 3 corresponding to the faulty fan, a heat source 1 corresponding to the faulty fan, so that compared with that the hot air enters the heat source 1 immediately after being expelled, this obviously not only does not exacerbate a high temperature of the heat source 1 corresponding to the faulty fan, but also can dissipate heat from the heat source 1, thereby improving a heat dissipation effect on the heat source.

In an example, when there is a faulty fan, there are a plurality of implementations in which an air guiding direction of an air guiding apparatus 3 corresponding to the faulty fan and an air guiding direction of an air guiding apparatus 3 corresponding to a neighboring fan deviate from each other.

Figure 4:
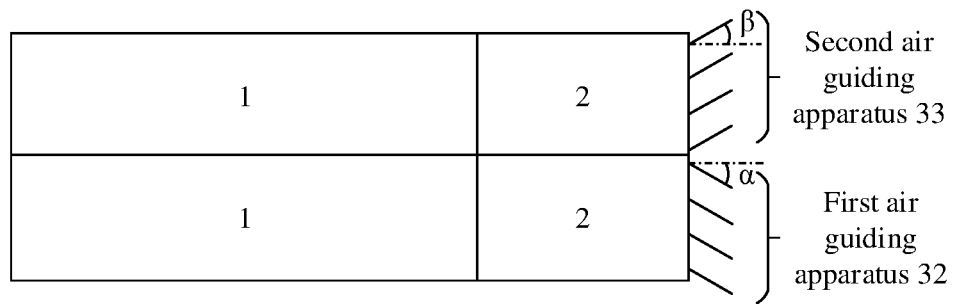
FIG. 4 is a schematic structural diagram of an electronic device system according to this application.

For example, as shown in FIG. 4, there are two air guiding apparatuses 3, which may be denoted as a first air guiding apparatus 32 and a second air guiding apparatus 33. When there is a faulty fan, an air guiding direction of the first air guiding apparatus 32 is inclined at negative $\alpha$ degrees to a horizontal direction, and an air guiding direction of the second air guiding apparatus 33 is inclined at positive $\beta$ degrees to the horizontal direction, where both $\alpha$ and $\beta$ are values ranging from 15 to 30.

Figure 5:
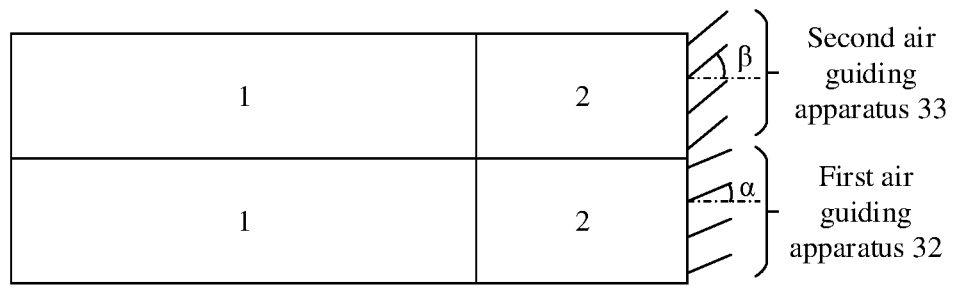
FIG. 5 is a schematic structural diagram of an electronic device system according to this application.

For another example, as shown in FIG. 5, there are two air guiding apparatuses 3, which may be denoted as a first air guiding apparatus 32 and a second air guiding apparatus 33. The first air guiding apparatus 32 is located below the second air guiding apparatus 33. When there is a faulty fan, an air guiding direction of the first air guiding apparatus 32 is inclined at positive $\alpha$ degrees to a horizontal direction, and an air guiding direction of the second air guiding apparatus 33 is inclined at positive $\beta$ degrees to the horizontal direction, where a is a value ranging from 45 to 60, and $\beta$ is a value ranging from 15 to 30.

Figure 6:
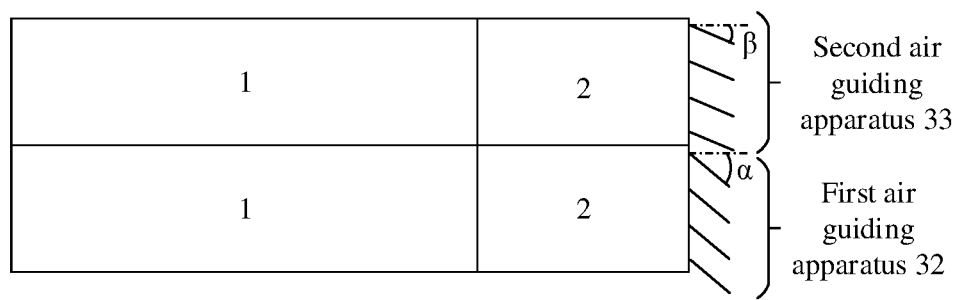
FIG. 6 is a schematic structural diagram of an electronic device system according to this application.

For another example, as shown in FIG. 6, there are two air guiding apparatuses 3, which may be denoted as a first air guiding apparatus 32 and a second air guiding apparatus 33. The first air guiding apparatus 32 is located below the second air guiding apparatus 33. When there is a faulty fan, an air guiding direction of the first air guiding apparatus 32 is inclined at negative $\alpha$ degrees to a horizontal direction, and an air guiding direction of the second air guiding apparatus 33 is inclined at negative $\beta$ degrees to the horizontal direction, where $\alpha$ is a value ranging from 15 to 30, and $\beta$ is a value ranging from 45 to 60.

In this way, in the two air guiding apparatuses 3, regardless of which fan 2 is faulty, that is, regardless of a specific air guiding apparatus 3 whose corresponding fan 2 is faulty, the following can be met, including an air guiding direction of the air guiding apparatus 3 corresponding to the faulty fan and an air guiding direction of an air guiding apparatus 3 corresponding to a neighboring fan adjacent to the faulty fan deviate from each other.

Figure 7:
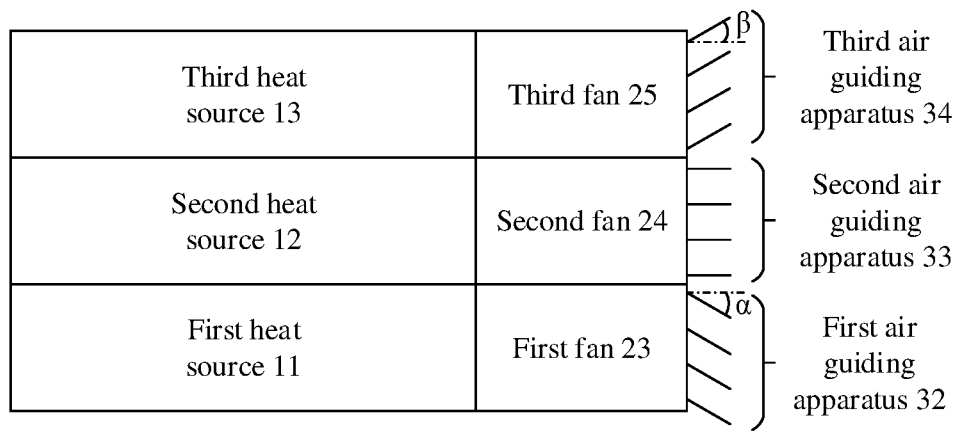
FIG. 7 is a schematic structural diagram of an electronic device system according to this application.

For another example, as shown in FIG. 7, there are three air guiding apparatuses 3, which may be denoted as a first air guiding apparatus 32, a second air guiding apparatus 33, and a third air guiding apparatus 34. The second air guiding apparatus 33 is located between the first air guiding apparatus 32 and the third air guiding apparatus 34. When there is a faulty fan, an air guiding direction of the first air guiding apparatus 32 is inclined at negative $\alpha$ degrees to a horizontal direction, an air guiding direction of the second air guiding apparatus 33 is parallel to the horizontal direction, and an air guiding direction of the third air guiding apparatus 34 is inclined at positive $\beta$ degrees to the horizontal direction, where both $\alpha$ and $\beta$ are values ranging from 30 to 60.

In this way, in the three air guiding apparatuses 3, regardless of which fan 2 is faulty, that is, regardless of a specific air guiding apparatus 3 whose corresponding fan 2 is faulty, the following can be met, including an air guiding direction of the air guiding apparatus 3 corresponding to the faulty fan and an air guiding direction of an air guiding apparatus 3 corresponding to a neighboring fan adjacent to the faulty fan deviate from each other.

Figure 8:
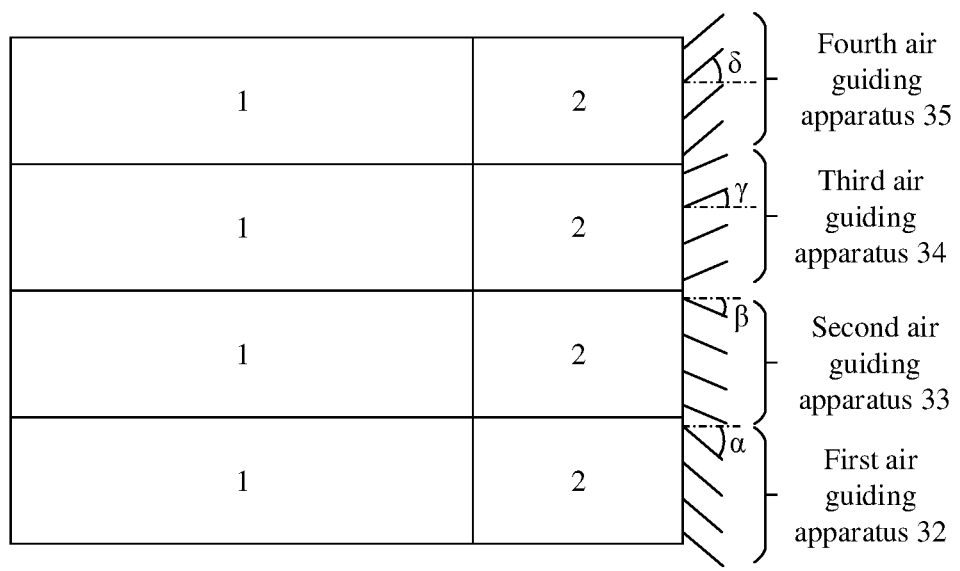
FIG. 8 is a schematic structural diagram of an electronic device system according to this application.

For another example, as shown in FIG. 8, there may be four air guiding apparatuses 3, which may be respectively denoted as a first air guiding apparatus 32, a second air guiding apparatus 33, a third air guiding apparatus 34, and a fourth air guiding apparatus 35. The first air guiding apparatus 32, the second air guiding apparatus 33, the third air guiding apparatus 34, and the fourth air guiding apparatus 35 are sequentially arranged adjacent to each other end-by-end. To be specific, the first air guiding apparatus 32 is adjacent to the second air guiding apparatus 33, the third air guiding apparatus 34 is adjacent to the second air guiding apparatus 33, and the fourth air guiding apparatus 35 is adjacent to the third air guiding apparatus 34.

When there is a faulty fan, an air guiding direction of the first air guiding apparatus 32 is inclined at negative $\alpha$ degrees to a horizontal direction, and an air guiding direction of the second air guiding apparatus 33 is inclined at negative $\beta$ degrees to the horizontal direction, where a is a value ranging from 45 to 60, and $\beta$ is a value ranging from 15 to 30, and an air guiding direction of the third air guiding apparatus 34 is inclined at positive $\gamma$ degrees to the horizontal direction, and an air guiding direction of the fourth air guiding apparatus 35 is inclined at positive δ degrees to the horizontal direction, where γ a value ranging from 15 to 30, and δ a value ranging from 45 to 60.

In this way, in the four air guiding apparatuses 3, regardless of which fan 2 is faulty, that is, regardless of a specific air guiding apparatus 3 whose corresponding fan 2 is faulty, the following can be met, including an air guiding direction of the air guiding apparatus 3 corresponding to the faulty fan and an air guiding direction of an air guiding apparatus 3 corresponding to a neighboring fan adjacent to the faulty fan deviate from each other.

If the air guiding apparatus 3 corresponding to the faulty fan and the air guiding apparatus 3 corresponding to the neighboring fan are located on different sides of the horizontal direction, as shown in FIG. 4, an angle by which the air guiding direction of the air guiding apparatus 3 corresponding to the faulty fan and the air guiding direction of the air guiding apparatus 3 corresponding to the neighboring fan deviate from each other is the sum of α and β. Alternatively, if the air guiding apparatus 3 corresponding to the faulty fan and the air guiding apparatus 3 corresponding to the neighboring fan are located on a same side of the horizontal direction, as shown in FIG. 5 and FIG. 6, an angle by which the air guiding direction of the air guiding apparatus 3 corresponding to the faulty fan and the air guiding direction of the air guiding apparatus 3 corresponding to the neighboring fan deviate from each other is an absolute value of a difference between α and β.

The foregoing describes solutions in which there are two, three, and four air guiding apparatuses, and a case in which there are more air guiding apparatuses 3 is similar to the foregoing. A person skilled in the art may flexibly select, based on an actual air guiding apparatus 3 corresponding to a faulty fan and an actual air guiding apparatus 3 corresponding to a neighboring fan, an air guiding direction of the air guiding apparatus 3 corresponding to the faulty fan and an air guiding direction of the air guiding apparatus 3 corresponding to the neighboring fan. This is not limited in this embodiment, provided that when there is a faulty fan, an air guiding direction of an air guiding apparatus 3 corresponding to the faulty fan and an air guiding direction of an air guiding apparatus 3 corresponding to a neighboring fan are away from each other.

To implement that when there is a faulty fan, an air guiding direction of an air guiding apparatus 3 corresponding to the faulty fan and an air guiding direction of an air guiding apparatus 3 corresponding to a neighboring fan adjacent to the faulty fan deviate from each other, correspondingly, in an implementation, an air guiding direction of each air guiding apparatus 3 is fixed, and air guiding directions of air guiding apparatuses 3 corresponding to two neighboring fans 2 deviate from each other.

During processing and manufacturing of the electronic device system, a person skilled in the art may determine air guiding directions of the air guiding apparatuses 3 based on a quantity of air guiding apparatuses 3 and locations of the air guiding apparatuses 3. Once processing and manufacturing are completed, the air guiding directions of the air guiding apparatuses 3 corresponding to the fans 2 are fixed and cannot be adjusted.

For example, during processing and manufacturing, if there are two air guiding apparatuses 3, a person skilled in the art may perform processing based on the air guiding directions of the air guiding apparatuses 3 shown in FIG. 4 to FIG. 6, if there are three air guiding apparatuses 3, a person skilled in the art may perform processing based on the air guiding directions of the air guiding apparatuses 3 shown in FIG. 7, or if there are four air guiding apparatuses 3, a person skilled in the art may perform processing based on the air guiding directions of the air guiding apparatuses 3 shown in FIG. 8.

The following may use the three air guiding apparatuses 3 shown in FIG. 7 as examples to describe setting of an air guiding direction of each air guiding apparatus 3 when the air guiding direction of each air guiding apparatus 3 is fixed.

As shown in FIG. 7, the electronic device system may include three heat sources 1, which are respectively denoted as a first heat source 11, a second heat source 12, and a third heat source 13. The heat source 1 and the fan 2 are in a one-to-one correspondence. Correspondingly, the electronic device system includes three fans 2, which are denoted as a first fan 23, a second fan 24, and a third fan 25. The fan 2 and the air guiding apparatus 3 are in a one-to-one correspondence. Correspondingly, the electronic device system includes three air guiding apparatuses 3, which are respectively denoted as a first air guiding apparatus 32, a second air guiding apparatus 33, and a third air guiding apparatus 34. The first heat source 11, the first fan 23, and the first air guiding apparatus 32 correspond to each other, the second heat source 12, the second fan 24, and the second air guiding apparatus 33 correspond to each other, and the third heat source 13, the third fan 25, and the third air guiding apparatus 34 correspond to each other. As shown in FIG. 7, an air guiding direction of an air deflector 31 of the first air guiding apparatus 32 is always inclined at negative α degrees to the horizontal direction, an air guiding direction of an air deflector 31 of the second air guiding apparatus 33 is always parallel to the horizontal direction, and an air guiding direction of an air deflector 31 of the third air guiding apparatus 34 is always inclined at positive β degrees to the horizontal direction, where both α and β are values greater than zero. For example, α and β both may be values ranging from 30 to 60, and may be equal or unequal.

A case in which the electronic device system includes two fans 2 or includes or more than three fans 2 is similar to the foregoing, and reference may be made to the foregoing description.

In this way, because air guiding directions of air guiding apparatuses 3 corresponding to two neighboring fans 2 deviate from each other, regardless of which fan 2 is faulty, the following can be met, including an air guiding direction of an air guiding apparatus 3 corresponding to the faulty fan and an air guiding direction of an air guiding apparatus 3 corresponding to a neighboring fan adjacent to the faulty fan deviate from each other. For example, the first fan 23 shown in FIG. 7 is a faulty fan, and the second fan 24 is a normal fan adjacent to the first fan 23. In this case, the following can also be met, including an air guiding direction of the first air guiding apparatus 32 corresponding to the first fan 23 and an air guiding direction of the second air guiding apparatus 33 corresponding to the second fan 24 deviate from each other. For another example, the second fan 24 shown in FIG. 7 is a faulty fan, and both the first fan 23 and the third fan 25 are normal fans adjacent to the second fan 24. In this case, the following can also be met, including an air guiding direction of the second air guiding apparatus 33 corresponding to the second fan 24 and an air guiding direction of the first air guiding apparatus 32 corresponding to the first fan 23 deviate from each other, and the air guiding direction of the second air guiding apparatus 33 corresponding to the second fan 24 and an air guiding direction of the third air guiding apparatus 34 corresponding to the third fan 25 deviate from each other.

In another implementation in which an air guiding direction of an air guiding apparatus 3 corresponding to a faulty fan and an air guiding direction of an air guiding apparatus 3 corresponding to a neighboring fan deviate from each other, an air guiding direction of each air guiding apparatus 3 can be adjusted, and an adjustment manner of the air guiding direction may be manual adjustment.

In an example, a plurality of air deflectors 31 of each air guiding apparatus 3 are connected through a connecting rod. For example, the air deflectors 31 of the air guiding apparatus 3 are all rotatably connected to the connecting rod. In this case, when a user moves one air deflector 31 of the air guiding apparatus 3 to adjust an air guiding direction of the air deflector 31, an air guiding direction of a remaining air deflector 31 of the air guiding apparatus 3 is adjusted together, so that the air guiding directions of the plurality of air deflector 31 of the same air guiding apparatus 3 are synchronously adjusted.

When a faulty fan is detected, in one adjustment manner, adjustment may be performed based on the air guiding directions of the air guiding apparatuses 3 shown in FIG. 4 to FIG. 8.

Figures 9, 10:
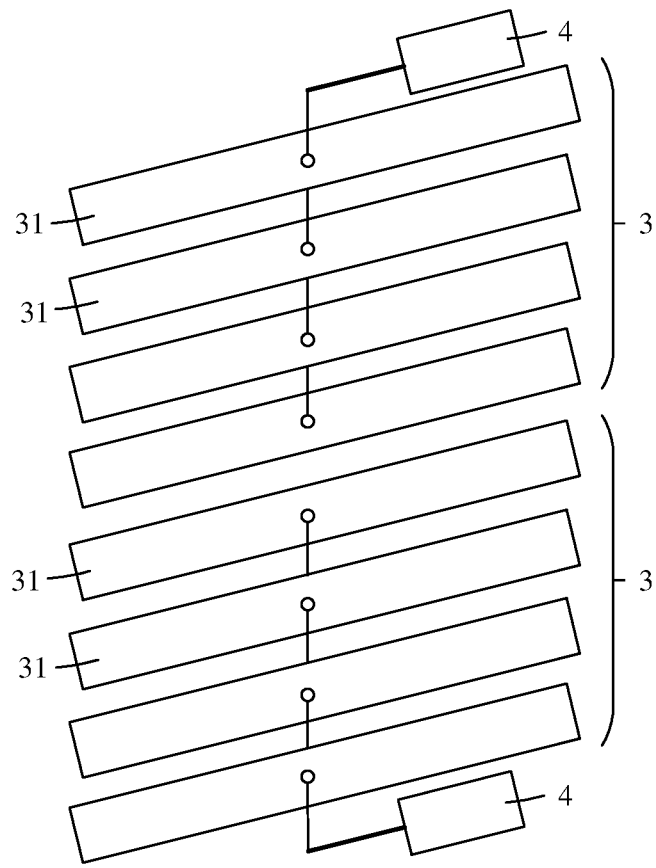
FIG. 9 is a schematic structural diagram of an electronic device system according to this application.
FIG. 10 is a schematic structural diagram of an air guiding apparatus adjusted by an adjustment motor according to this application.
Figure 11:
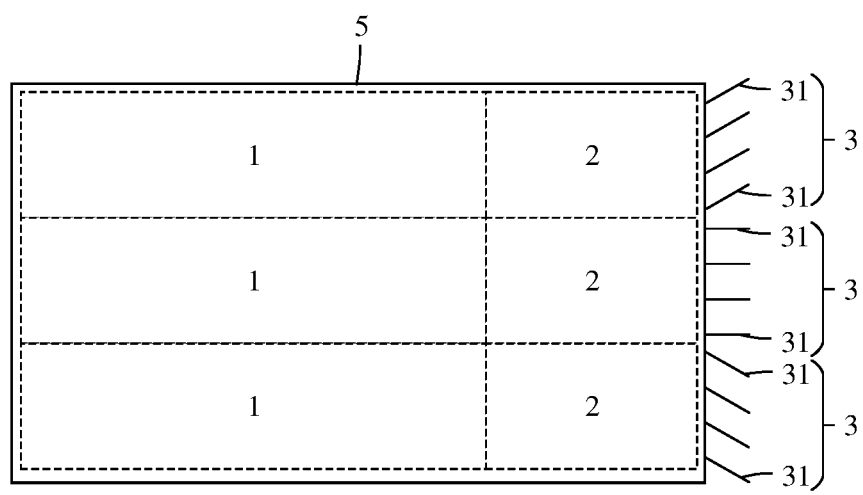
FIG. 11 is a schematic structural diagram of an electronic device system including a cabinet according to this application.

In another adjustment manner, since the air guiding direction of the air guiding apparatus 3 is adjustable, if all the fans 2 are in a normal state, the air guiding directions of the air guiding apparatuses 3 all can be parallel to the horizontal direction. That the electronic device system includes three heat sources 1, three fans 2, and three air guiding apparatuses 3 is still used as an example. When a user finds that a fan is faulty, for example, as shown in FIG. 9, the first fan 23 is faulty, an air guiding direction of the first air guiding apparatus 32 corresponding to the first fan 23 and an air guiding direction of the second air guiding apparatus 33 corresponding to the second fan 24 adjacent to the first fan 23 may be adjusted, so that the air guiding direction of the first air guiding apparatus 32 and the air guiding direction of the second air guiding apparatus 33 are away from each other. For example, an air deflector 31 of the first air guiding apparatus 32 is adjusted to deviate from the horizontal direction by negative α degrees, and an air guiding direction of an air deflector 31 of the second air guiding apparatus 33 corresponding to the second fan 24 and an air guiding direction of an air deflector 31 of the third air guiding apparatus 34 corresponding to the third fan 25 are unchanged and are still in the horizontal direction.

For another example, if the second fan 24 is faulty, an air guiding direction of the first air guiding apparatus 32 corresponding to the first fan 23 and an air guiding direction of the third air guiding apparatus 34 corresponding to the third fan 25 may be adjusted, so that an air guiding direction of the second air guiding apparatus 33 deviate from both the air guiding direction of the first air guiding apparatus 32 and the air guiding direction of the third air guiding apparatus 34. For example, refer to FIG. 7. An air deflector 31 of the first air guiding apparatus 32 is adjusted to deviate from the horizontal direction by negative α degrees, an air deflector 31 of the third air guiding apparatus 34 corresponding to the third fan 25 is adjusted to deviate from the horizontal direction by positive β degrees, and a direction of an air deflector 31 of the second air guiding apparatus 33 corresponding to the second fan 24 is unchanged and is still in the horizontal direction, where α and β both are values greater than zero, and may be equal or unequal.

It can be learned that the air guiding direction of the air guiding apparatus 3 can be manually adjusted. Therefore, regardless of which fan 2 is faulty, the following can be met, including an air guiding direction of an air guiding apparatus 3 corresponding to the faulty fan and an air guiding direction of an air guiding apparatus 3 corresponding to a neighboring fan adjacent to the faulty fan deviate from each other.

In another implementation in which an air guiding direction of an air guiding apparatus 3 corresponding to a faulty fan and an air guiding direction of an air guiding apparatus 3 corresponding to a neighboring fan deviate from each other, an air guiding direction of each air guiding apparatus 3 can be adjusted, and an adjustment manner of the air guiding direction may be automatic adjustment.

In an example, as shown in FIG. 10, the electronic device system may further include an adjustment motor 4, and a control unit of the electronic device system is configured to, when detecting a faulty fan, control, by using the adjustment motor 4, an air guiding direction of an air guiding apparatus 3 corresponding to the faulty fan and an air guiding direction of an air guiding apparatus 3 corresponding to a neighboring fan to deviate from each other.

A quantity of adjustment motors 4 may be the same as a quantity of air guiding apparatuses 3, and the adjustment motor 4 and the air guiding apparatus 3 are in a one-to-one correspondence. One air guiding apparatus 3 is adjusted by one adjustment motor 4. In this case, as shown in FIG. 10, a plurality of air deflectors 31 of each air guiding apparatus 3 are connected through a connecting rod. An output shaft of an adjustment motor 4 corresponding to the air guiding apparatus 3 is connected to the connecting rod. In this way, when the output shaft of the adjustment motor 4 rotates, the connecting rod can be driven to move, and when the connecting rod moves, an air guiding direction of the air deflector 31 connected to the connecting rod can be driven to be adjusted.

Alternatively, a quantity of adjustment motors 4 may be different from a quantity of air guiding apparatuses 3. For example, one adjustment motor 4 drives all air guiding apparatuses 3 to adjust air guiding directions, or one adjustment motor 4 drives a plurality of air guiding apparatuses 3 to adjust air guiding directions. In this case, an output shaft of the adjustment motor 4 may be connected to a plurality of connecting rods, and each connecting rod is connected to an air deflector 31 of one air guiding apparatus 3. When the output shaft of the adjustment motor 4 rotates, all the connecting rods connected to the adjustment motor 4 can be driven to move, to drive air guiding directions of air deflectors 31 of all air guiding apparatuses 3 to be adjusted.

A correspondence between the adjustment motor 4 and the air guiding apparatus 3 is not limited in this embodiment. A person skilled in the art may flexibly select a correspondence based on an actual situation. For ease of description, that the adjustment motor 4 and the air guiding apparatus 3 are in a one-to-one correspondence is used as an example in the following.

When a faulty fan is detected, in one adjustment manner, adjustment may be performed based on the air guiding directions of the air guiding apparatuses 3 shown in FIG. 4 to FIG. 8.

In another adjustment manner, since the air guiding direction of the air guiding apparatus 3 is adjustable, if all the fans 2 are in a normal state, the control unit may control air guiding directions of all the air guiding apparatuses 3 to be parallel to the horizontal direction. That the electronic device system includes three heat sources 1, three fans 2, and three air guiding apparatuses 3 is still used as an example. When the control unit detects that a fan is faulty, refer to FIG. 9. For example, the first fan 23 is faulty, the control unit may adjust an air guiding direction of the first air guiding apparatus 32 corresponding to the first fan 23 and an air guiding direction of the second air guiding apparatus 33 corresponding to the second fan 24 adjacent to the first fan 23, so that the air guiding direction of the first air guiding apparatus 32 and the air guiding direction of the second air guiding apparatus 33 deviate from each other. For example, the control unit adjusts an air deflector 31 of the first air guiding apparatus 32 to deviate from the horizontal direction by negative α degrees, and an air guiding direction of an air deflector 31 of the second air guiding apparatus 33 corresponding to the second fan 24 and an air guiding direction of an air deflector 31 of the third air guiding apparatus 34 corresponding to the third fan 25 are unchanged and are still in the horizontal direction.

For another example, if the second fan 24 is faulty, the control unit may adjust an air guiding direction of the first air guiding apparatus 32 corresponding to the first fan 23 and an air guiding direction of the third air guiding apparatus 34 corresponding to the third fan 25, so that an air guiding direction of the second air guiding apparatus 33 deviate from both the air guiding direction of the first air guiding apparatus 32 and the air guiding direction of the third air guiding apparatus 34. For example, refer to FIG. 7. The control unit adjusts an air deflector 31 of the first air guiding apparatus 32 to deviate from the horizontal direction by negative α degrees, and adjusts an air deflector 31 of the third air guiding apparatus 34 corresponding to the third fan 25 to deviate from the horizontal direction by positive β degrees, and a direction of an air deflector 31 of the second air guiding apparatus 33 corresponding to the second fan 24 is unchanged and is still in the horizontal direction, where α and β both are values greater than zero, and may be equal or unequal.

It can be learned that the air guiding direction of the air guiding apparatus 3 can be automatically adjusted by using the control unit and the adjustment motor. Therefore, regardless of which fan 2 is faulty, the following can be met, including an air guiding direction of an air guiding apparatus 3 corresponding to the faulty fan and an air guiding direction of an air guiding apparatus 3 corresponding to a neighboring fan adjacent to the faulty fan deviate from each other.

In an example, when the control unit adjusts and controls an air guiding direction of an air guiding apparatus 3 corresponding to a faulty fan and an air guiding direction of an air guiding apparatus 3 corresponding to a neighboring fan to deviate from each other, to achieve a relatively good heat dissipation effect, the control unit may correspondingly adjust, based on a temperature of a heat source 1 corresponding to the faulty fan, an angle by which the air guiding direction of the air guiding apparatus 3 corresponding to the faulty fan and the air guiding direction of the air guiding apparatus 3 corresponding to the neighboring fan deviate from each other. Correspondingly, the control unit may be specifically configured to, when detecting the faulty fan, determine a target angle based on a lowest temperature of the heat source 1 corresponding to the faulty fan, and control, by using the adjustment motor 4, the air guiding direction of the air guiding apparatus 3 corresponding to the faulty fan and the air guiding direction of the air guiding apparatus 3 corresponding to the neighboring fan to deviate from each other based on the target angle.

For example, the control unit may pre-store a plurality of deviation angles, then select one of the plurality of deviation angles as the target angle based on a temperature of the heat source 1 corresponding to the faulty fan, and further control, by using the adjustment motor 4, the air guiding direction of the air guiding apparatus 3 corresponding to the faulty fan and the air guiding direction of the air guiding apparatus 3 corresponding to the neighboring fan to deviate from each other based on the selected target angle.

For example, the control unit stores three deviation angles, which are respectively denoted as a first angle, a second angle, and a third angle. That the electronic device system includes three heat sources 1, three fans 2, and three air guiding apparatuses 3 is still used as an example. Refer to FIG. 9. When detecting that the first fan 23 in the three fans 3 is faulty, the control unit first controls, by using the adjustment motor 4, air guiding directions of the first air guiding apparatus 32 and the second air guiding apparatus 33 to deviate from each other based on the first angle for specific duration, and records a first temperature that is of the first heat source 11 corresponding to the first fan 23 and that is during the mutual deviation based on the first angle. The first temperature may be an average temperature in the specified duration. Then, the control unit controls, by using the adjustment motor 4, the air guiding directions of the first air guiding apparatus 32 and the second air guiding apparatus 33 to deviate from each other based on the second angle for specified duration, and records a second temperature that is of the first heat source 11 corresponding to the first fan 23 and that is during the mutual deviation based on the second angle. The second temperature may be an average temperature in the specified duration. Afterwards, the control unit controls, by using the adjustment motor 4, the air guiding directions of the first air guiding apparatus 32 and the second air guiding apparatus 33 to deviate from each other based on the third angle for specified duration, and records a third temperature that is of the first heat source 11 corresponding to the first fan 23 and that is during the mutual deviation based on the third angle. The third temperature may be an average temperature in the specified duration. Further, the control unit selects a lowest temperature from the first temperature, the second temperature, and the third temperature, determines a deviation angle corresponding to the lowest temperature as the target angle. For example, if the second temperature is the lowest, the second angle corresponding to the second temperature is selected as the target angle. Next, the control unit may control, by using the adjustment motor 4, the air guiding directions of the first air guiding apparatus 32 and the second air guiding apparatus 33 to deviate from each other based on the selected target angle.

In this way, when there is a faulty fan, an angle by which an air guiding direction of an air guiding apparatus 3 corresponding to the faulty fan and an air guiding direction of an air guiding apparatus 3 corresponding to a neighboring fan deviate from each other is adjusted and controlled based on a heat dissipation condition of a heat source 1 corresponding to the faulty fan and heat dissipation optimization, thereby improving a heat dissipation effect on the heat source 1.

In the foregoing description, the control unit adjusts and controls an angle by which an air guiding direction of an air guiding apparatus 3 corresponding to a faulty fan and an air guiding direction of an air guiding apparatus 3 corresponding to a neighboring fan deviate from each other. In addition to adjust and control the deviation angle, the control unit may further adjust and control the air guiding direction of the air guiding apparatus 3 corresponding to the faulty fan and the air guiding direction of the air guiding apparatus 3 corresponding to the neighboring fan. In one example, based on the heat dissipation optimization, the control unit may adjust and control the air guiding direction of the air guiding apparatus 3 corresponding to the faulty fan, and the angle by which the air guiding direction of the air guiding apparatus 3 corresponding to the faulty fan and the air guiding direction of the air guiding apparatus 3 corresponding to the neighboring fan deviate from each other. In another example, based on the heat dissipation optimization, the control unit adjusts and controls the air guiding direction of the air guiding apparatus 3 corresponding to the faulty fan and the air guiding direction of the air guiding apparatus 3 corresponding to the neighboring fan.

The control unit may adjust and control only the air guiding direction of the air guiding apparatus 3 corresponding to the faulty fan and the air guiding direction of the air guiding apparatus 3 corresponding to the neighboring fan, and an air guiding direction of an air guiding apparatus 3 corresponding to a remaining fan may still maintain a default state, for example, may be still parallel to the horizontal direction. Certainly, the control unit may flexibly select, based on an actual situation, an air guiding direction that is of an air guiding apparatus 3 and that needs to be adjusted and controlled. This is not limited in this embodiment.

The foregoing is several possible implementations in which an air guiding direction of an air guiding apparatus 3 corresponding to a faulty fan and an air guiding direction of an air guiding apparatus 3 corresponding to a neighboring fan deviate from each other. The foregoing is merely an example, and constitutes no limitation.

As described above, the air guiding apparatus 3 is located on the air outlet side 22 of the fan 2. In terms of fastening location, the air guiding apparatus 3 may be directly fastened on the air outlet side 22 of the fan 2. For example, the plurality of air guiding apparatuses 3 may be fastened on outer surfaces of housings of the plurality of fans 2.

In one example, the electronic device system includes a heat source 1, a fan 2, and an air guiding apparatus 3. An air inlet side 21 of the fan 2 may be fastened on a rear end face of the heat source 1, the air guiding apparatus 3 may be fastened on an air outlet side 22 of the fan 2, and the fan 2 is located between the heat source 1 and the air guiding apparatus 3. Both a front panel and the rear end face of the heat source 1 have perforated plates for ventilation and heat dissipation.

In another example, the electronic device system includes not only a heat source 1, a fan 2, and an air guiding apparatus 3, but also a cabinet 5, as shown in FIG. ii. The cabinet 5 may have a box-shaped structure, and has a slot configured to install the heat source 1 and the fan 2. The heat source 1 and the fan 2 may be installed in the slot, a front panel of the heat source 1 is located at an opening of the slot, and the fan 2 is located at a bottom of the slot. The heat source 1 and the fan 2 may be fastened to the cabinet 5, and the heat source 1 and the fan 2 are not fastened to each other, but a rear end face of the heat source 1 is adjacent to or even attached to an air inlet side 21 of the fan 2. Alternatively, the heat source 1 and the fan 2 may be fastened to the cabinet 5, and the rear end face of the heat source 1 and the air inlet side 21 of the fan 2 are also fastened to each other. An installation relationship between the heat source 1 and the fan 2 in the cabinet 5 is not limited in this embodiment, provided that the air inlet side 21 of the fan 2 is located on the rear end face of the heat source 1, so that cold air on the front panel of the heat source 1 can be sucked into the heat source 1.

For an installation location of the air guiding apparatus 3, in one manner, the air guiding apparatus 3 is fastened to the fan 2. For example, the air guiding apparatus 3 is fastened on an outer surface of a housing of the fan 2, and an end that is of the air guiding apparatus 3 and that is away from the fan 2 is attached to an inner surface of the cabinet 5. In another manner, as shown in FIG. ii, the air guiding apparatus 3 is fastened on an outer surface of a wall of the cabinet 5. For example, an air outlet side 22 of the fan 2 is adjacent to or even attached to an inner surface of the wall of the cabinet 5, and the air guiding apparatus 3 is fastened on the outer surface of the wall of the cabinet 5. For example, the air guiding apparatus 3 is fastened on an outer surface of the bottom of the slot of the cabinet 5. A specific installation location of the air guiding apparatus 3 is not limited in this embodiment, provided that the air guiding apparatus 3 is located on the air outlet side 22 of the fan 2, so that hot air expelled from the fan 2 is expelled out of the electronic device system through the air guiding apparatus 3.

Regardless of whether the air guiding apparatus 3 is installed on the fan 2 or installed on the cabinet 5, the bottom of the slot of the cabinet 5 has a perforated plate for ventilation and heat dissipation.

The air guiding apparatus 3 is fastened on the outer surface of the wall of the cabinet 5, and the air guiding apparatus 3 occupies no space inside the wall of the cabinet, so that without an increase in a size of the wall of the cabinet, the air guiding apparatus 3 can guide away hot air expelled from the fan 2, thereby facilitating heat dissipation inside the wall of the cabinet.

Figure 12:
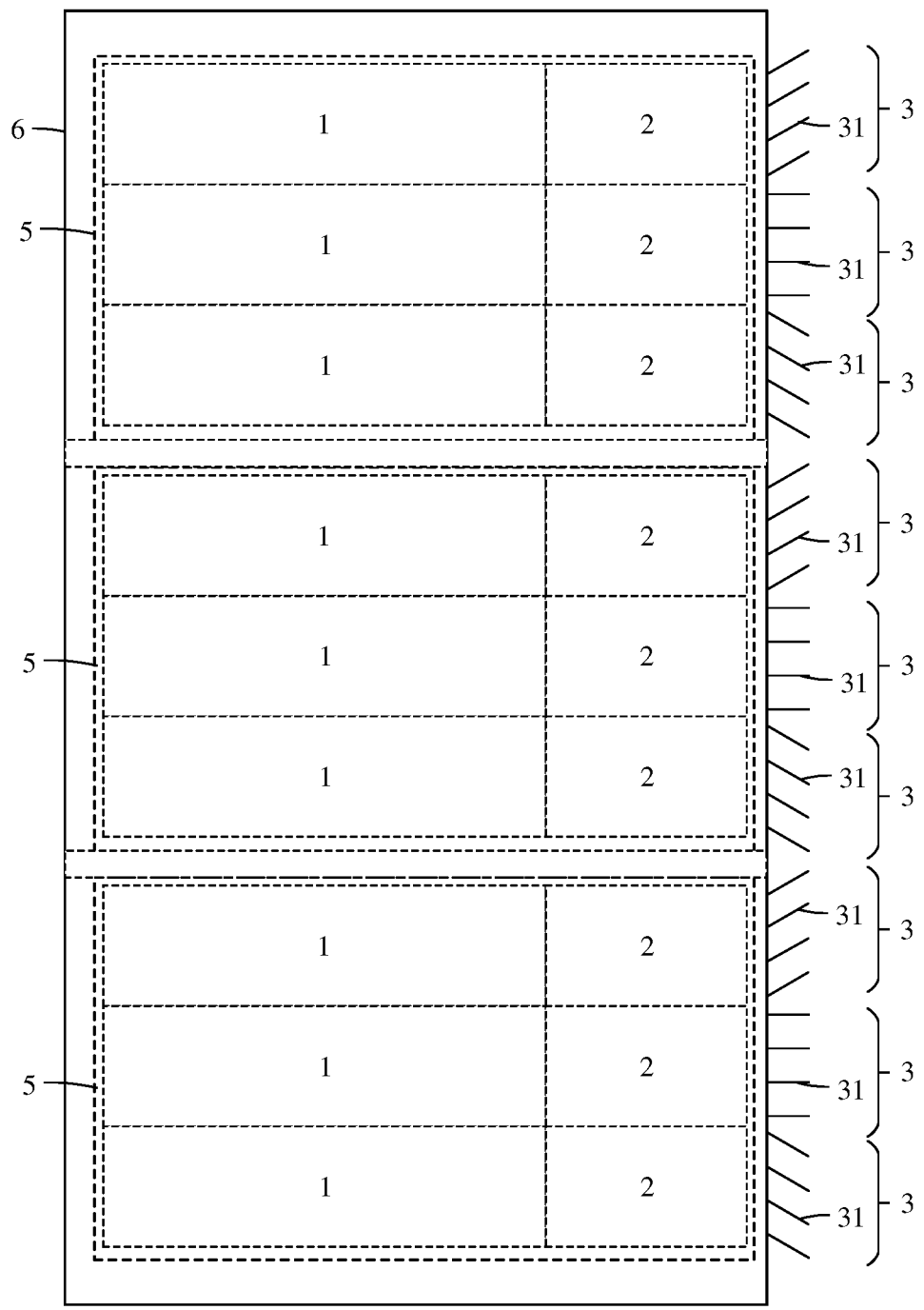
FIG. 12 is a schematic structural diagram of an electronic device system including a cabinet and a rack according to this application.

In another example, the electronic device system not only includes a heat source 1, a fan 2, and an air guiding apparatus 3, but also may include a rack 6, as shown in FIG. 12. The rack 6 may be a grounded rack, and may include two doors, two side plates, one top plate, and one bottom plate. Both doors of the rack 6 have perforated plates for ventilation and heat dissipation. The heat source 1 and the fan 2 may be installed in the rack 6. A front panel of the heat source 1 is located at one door of the rack 6, and an air outlet side 22 of the fan 2 is located at the other door of the rack 6. A door of the rack 6 that is on the front panel of the heat source 1 may be referred to as a front door of the rack 6, and a door of the rack 6 that is on the air outlet side 22 of the fan 2 may be referred to as a rear door of the rack 6.

The heat source 1 and the fan 2 in the rack 6 may be in a fastening relationship or may not be in a fastening relationship. This is not limited in this embodiment, provided that an air inlet side 21 of the fan 2 is located on a rear end face of the heat source 1, so that cold air on the front panel of the heat source 1 can be sucked into the heat source 1.

For an installation location of the air guiding apparatus 3, in one manner, the air guiding apparatus 3 is fastened to the fan 2. For example, the air guiding apparatus 3 is fastened on an outer surface of a housing of the fan 2, and an end that is of the air guiding apparatus 3 and that is away from the fan 2 is adjacent to or even attached to an inner surface of the rack 6. In another manner, the air guiding apparatus 3 is fastened to the door of the rack 6. For example, the air outlet side 22 of the fan 2 is attached to an inner surface of the door of the rack 6, and the air guiding apparatus 3 is fastened on an outer surface of the door of the rack. A specific installation location of the air guiding apparatus 3 is not limited in this embodiment, provided that the air guiding apparatus 3 is located on the air outlet side 22 of the fan 2, so that hot air expelled from the fan 2 is expelled out of the electronic device system through the air guiding apparatus 3.

In another example, the electronic device system not only includes a heat source 1, a fan 2, and an air guiding apparatus 3, but also may include a cabinet 5 and a rack 6. Correspondingly, the cabinet 5 has a slot, and the heat source 1 and the fan 2 are installed in the slot of the cabinet 5. A plurality of heat sources 1 and a plurality of fans 2 may be installed in each cabinet 5. For an installation relationship between the heat source 1 and the fan 2 in the cabinet 5, reference may be made to the foregoing description. A plurality of cabinets 5 installed with the heat source 1 and the fan 2 may be installed in the rack 6. A front panel of the heat source 1 is located at one door of the rack 6, and an air outlet side 22 of the fan 2 is located at the other door of the rack 6. A door of the rack 6 that is on the front panel of the heat source 1 may be referred to as a front door of the rack 6, and a door of the rack 6 that is on the air outlet side 22 of the fan 2 may be referred to as a rear door of the rack 6.

For an installation location of the air guiding apparatus 3, in one manner, the air guiding apparatus 3 is fastened to the fan 2. For example, the air guiding apparatus 3 is fastened on an outer surface of a housing of the fan 2, and an end that is of the air guiding apparatus 3 and that is away from the fan 2 is adjacent to or even attached to an inner surface of a wall of the cabinet 5. The wall of the cabinet 5 is adjacent to or even attached to the rear door of the rack 6. In another manner, the fan 2 is fastened to the cabinet 5. For example, the air outlet side 22 of the fan 2 is adjacent to or even attached to an inner surface of a wall of the cabinet 5, the air guiding apparatus 3 is fastened on an outer surface of the wall of the cabinet 5, and an end that is of the air guiding apparatus 3 and that is away from the cabinet 5 is adjacent to or even attached to an inner surface of a wall of the rack 6. In another manner, as shown in FIG. 12, the air guiding apparatus 3 is fastened to the rack 6. For example, the air outlet side 22 of the fan 2 is adjacent to or even attached to an inner surface of a wall of the cabinet 5, the wall of the cabinet 5 is adjacent to or even attached to an inner surface of the rear door of the rack 6, and the air guiding apparatus 3 is fastened on an outer surface of the rear door of the rack 6. A specific installation location of the air guiding apparatus 3 is not limited in this embodiment, provided that the air guiding apparatus 3 is located on the air outlet side 22 of the fan 2, so that hot air expelled from the fan 2 is expelled out of the electronic device system through the air guiding apparatus 3.

The air guiding apparatus 3 is fastened on the outer surface of the door of the rack 6, and the air guiding apparatus 3 occupies no space inside the rack 6, so that without an increase in a size of the rack 6, the air guiding apparatus 3 can guide away hot air expelled from the fan 2, thereby facilitating heat dissipation inside the rack 6.

The foregoing describes a specific structure of the electronic device system and a specific installation location of the air guiding apparatus 3 in the electronic device system in each structure. The following may describe an application scenario of the electronic device system in a structure in which the electronic device system further includes the cabinet 5 and the rack 6, and the air guiding apparatus 3 is fastened to the rack 6.

Figure 13:
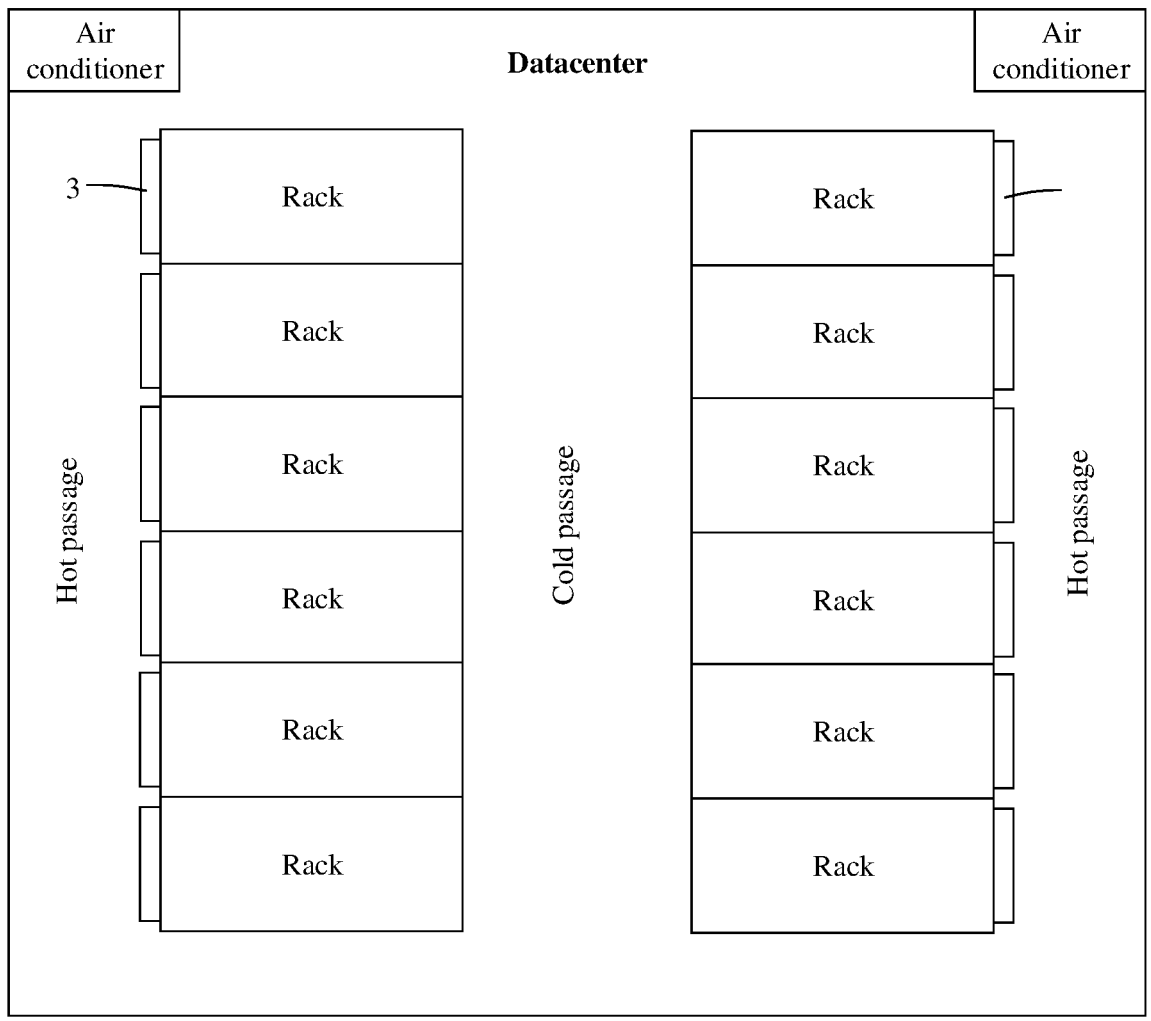
FIG. 13 is a schematic scenario diagram of an electronic device system including a cabinet and a rack according to this application.

As shown in FIG. 13, racks 6 are arranged in rows in a datacenter having a refrigerating air conditioner, and there is a passage between two neighboring rows of racks 6. Because a passage at the rear door of the rack 6 is adjacent to the air outlet side 22 of the fan 2, and the air outlet side 22 of the fan 2 expels hot air, a temperature in the passage on the air outlet side 22 of the fan 2 is relatively high. Therefore, the passage adjacent to the air outlet side 22 of the fan 2 may be referred to as a hot passage or may be referred to as a hot channel. Corresponding to the hot passage, a passage between the racks 6 that is away from the air outlet side 22 of the fan 2, that is, a passage between the racks 6 that is adjacent to the front panel of the heat source 1, may be referred to as a cold passage or may be referred to as a cold passage.

In this way, the fan 2 located at the rear door of the rack 6 may draw cold air in the cold passage into the rack 6. The cold air flows through a heat dissipation channel inside the rack 6, and sucks heat generated by the heat source 1 inside the rack 6 to generate hot air. The hot air is then guided away from the electronic device system by the air outlet side 22 of the fan 2, the perforated plate on the rear door of the rack 6, and the air guiding apparatus 3 on the outer surface of the rear door of the rack 6.

When all fans 2 in the rack 6 run well, air guiding directions of air guiding apparatuses 3 all may be parallel to the horizontal direction, that is, air deflectors 31 of the air guiding apparatuses 3 are all perpendicular to the rear door of the rack 6.

However, when there is a faulty fan in the rack 6, an air guiding direction of an air guiding apparatus 3 corresponding to the faulty fan and an air guiding direction of an air guiding apparatus 3 corresponding to a neighboring fan deviate from each other, so that hot air guided away by the air guiding apparatus 33 corresponding to the neighboring fan can be cooled when flowing in an environment, and then enter the rack 6 through the air guiding apparatus 3 corresponding to the faulty fan, to dissipate heat from the heat source 1 corresponding to the faulty fan 23.

In this embodiment of this application, the electronic device system includes the heat source, the fan, and the air guiding apparatus. The heat source is located on the air inlet side 21 of the fan, and the air guiding apparatus is located on the air outlet side 22 of the fan. When there is a faulty fan, an air guiding direction of an air guiding apparatus corresponding to the faulty fan and an air guiding direction of an air guiding apparatus corresponding to a neighboring fan deviate from each other. In this way, even if there is a faulty fan, hot air expelled from a neighboring fan adjacent to the faulty fan is guided by an air guiding apparatus corresponding to the neighboring fan to be cooled when flowing in a low temperature environment, and then cooled air enters the electronic device system through an air guiding apparatus corresponding to the faulty fan, so that not only a high temperature inside the electronic device system is not exacerbated, but also heat can be dissipated from the heat source, thereby facilitating heat dissipation of the heat source.

An embodiment of this application further provides a method for manufacturing an electronic device system, and the method includes installing a heat source 1, a plurality of fans 2, and a plurality of air guiding apparatuses 3. The heat source 1 is located on air inlet sides 21 of the plurality of fans 2, and the plurality of air guiding apparatuses 3 are located on air outlet sides 22 of the plurality of fans 2. The plurality of air guiding apparatuses 3 are configured as follows. When there is a faulty fan, an air guiding direction of an air guiding apparatus 3 corresponding to the faulty fan and an air guiding direction of an air guiding apparatus 3 corresponding to a neighboring fan deviate from each other.

When the heat source 1, the plurality of fans 2, and the plurality of air guiding apparatuses 3 are installed, the heat source 1 and the plurality of fans 2 may be installed before the air guiding apparatuses, or the air guiding apparatuses may be installed before the heat source 1 and the plurality of fans 2. A specific installation sequence is not limited in this embodiment.

In an example, when the heat source 1 and the plurality of fans 2 are installed, the heat source 1 is located on the air inlet sides 21 of the plurality of fans 2. For example, the air inlet sides 21 of the plurality of fans 2 may be installed on a rear end face of the heat source 1. The fan 2 and the heat source 1 may be in a fastening relationship, or may not be in a fastening relationship. This is not limited in this embodiment, provided that the air inlet side 21 of the fan 2 is attached to the rear end face of the heat source 1.

In an example, when the plurality of fans 2 and the plurality of air guiding apparatuses 3 are installed, the plurality of air guiding apparatuses 3 are located on the air outlet sides 22 of the plurality of fans 2. For example, the plurality of air guiding apparatuses 3 may be installed on the air outlet sides 22 of the plurality of fans 2. The air guiding apparatus 3 and the fan 2 may be in a fastening relationship, or may not be in a fastening relationship. This is not limited in this embodiment, provided that the air guiding apparatus 3 is relatively close to the air outlet side 22 of the fan 2. The air guiding apparatus 3 may be attached to or approximately attached to the air outlet side 22 of the fan 2.

The plurality of air guiding apparatuses 3 have the following function. When there is a faulty fan, an air guiding direction of an air guiding apparatus 3 corresponding to the faulty fan and an air guiding direction of an air guiding apparatus 3 corresponding to a neighboring fan deviate from each other.

In this way, hot air expelled from the neighboring fan adjacent to the faulty fan is guided by the corresponding air guiding apparatus 3 to be cooled when flowing in a low temperature environment, and then cooled air enters the electronic device system through the air guiding apparatus 3 corresponding to the faulty fan, so that not only a high temperature inside the electronic device system is not exacerbated, but also heat can be dissipated from the heat source 1, thereby facilitating heat dissipation of the heat source 1.

In an example, when the plurality of fans 2 and the plurality of air guiding apparatuses 3 are installed, the plurality of air guiding apparatuses 3 may be installed on outer surfaces of housings of the plurality of fans 2.

In another example, the electronic device system further includes a cabinet 5. In this case, when the heat source 1 and the plurality of fans 2 are installed, the heat source 1 and the plurality of fans 2 may be installed in the cabinet 5. For example, the cabinet 5 has a slot, and the heat source 1 and the plurality of fans 2 may be installed in the slot. A front panel of the heat source is located at an opening of the slot, the fan 2 is located at a bottom of the slot, and the air inlet side 21 of the fan 2 is adjacent to or even attached to a rear end face of the heat source 1. When the plurality of fans 2 and the plurality of air guiding apparatuses 3 are installed, the plurality of air guiding apparatuses 3 may be installed on an outer surface of a wall of the cabinet 5. For example, the air guiding apparatus 3 may be fastened on an outer surface of the bottom of the slot of the cabinet 5.

In this way, the air guiding apparatus 3 is installed on the outer surface of the wall of the cabinet 5, and occupies no space inside the cabinet 5, so that installation space of the cabinet 5 can be saved.

In another example, the electronic device system may further include a cabinet 5 and a rack 6. In this case, when the heat source 1 and the plurality of fans 2 are installed, the heat source 1 and the plurality of fans 2 may be installed in the cabinet 5, and the cabinet 5 is installed in the rack 6. For a process of installing the heat source 1 and the plurality of fans 2 in the cabinet 5, reference may be made to the foregoing description. A plurality of cabinets 5 installed with the heat source 1 and the plurality of fans 2 can be piled together and installed in the rack 6. A front panel of the heat source 1 is located at one door of the rack 6, and the air outlet side 22 of the fan 2 is located at the other door of the rack 6. For example, the front panel of the heat source 1 is located at a front door of the rack 6, and the air outlet side 22 of the fan 2 is located at a rear door of the rack 6. When the plurality of fans 2 and the plurality of air guiding apparatuses 3 are installed, the plurality of air guiding apparatuses 3 may be installed on an outer surface of the door of the rack 6. For example, the plurality of air guiding apparatuses 3 are fastened on an outer surface of the rear door of the rack 6.

In this way, the air guiding apparatus 3 is installed on the outer surface of the door of the rack 6, and occupies no space inside the rack 6, so that installation space of the rack 6 can be saved.

In the electronic device system processed by using the manufacturing method, the heat source is located on the air inlet side 21 of the fan, and the air guiding apparatus is located on the air outlet side 22 of the fan. When there is a faulty fan, an air guiding direction of an air guiding apparatus corresponding to the faulty fan and an air guiding direction of an air guiding apparatus corresponding to a neighboring fan deviate from each other. In this way, hot air expelled from the neighboring fan is guided by the air guiding apparatus 3 corresponding to the neighboring fan to be cooled when flowing in a low temperature environment, and then cooled air enters the electronic device system through the air guiding apparatus 3 corresponding to the faulty fan, so that not only a high temperature inside the electronic device system is not exacerbated, but also heat can be dissipated from the heat source, thereby facilitating heat dissipation of the heat source.

An embodiment of this application further provides a method for controlling an electronic device system. The method may be applied to an electronic device system in which an air guiding direction of an air guiding apparatus 3 can be adjusted. The method may include controlling, when detecting a faulty fan, an air guiding direction of an air guiding apparatus 3 corresponding to the faulty fan and an air guiding direction of an air guiding apparatus 3 corresponding to a neighboring fan to deviate from each other.

In an example, the controlling, when detecting a faulty fan, an air guiding direction of an air guiding apparatus 3 corresponding to the faulty fan and an air guiding direction of an air guiding apparatus 3 corresponding to a neighboring fan to deviate from each other may be specifically performed in the following manner, including when detecting the faulty fan, determining a target angle based on a lowest temperature of a heat source 1 corresponding to the faulty fan, and controlling the air guiding direction of the air guiding apparatus 3 corresponding to the faulty fan and the air guiding direction of the air guiding apparatus 3 corresponding to the neighboring fan to deviate from each other based on the target angle.

The control method may be executed by a control unit of the electronic device system. A specific control process has been described above, and details are not described herein again.

In the control method, the air guiding direction of the air guiding apparatus can be automatically adjusted. Therefore, regardless of which fan is faulty, the following can be met, including an air guiding direction of an air guiding apparatus corresponding to the faulty fan and an air guiding direction of an air guiding apparatus corresponding to a neighboring fan adjacent to the faulty fan deviate from each other. In this way, when there is a faulty fan, hot air expelled from a neighboring fan adjacent to the faulty fan is guided by an air guiding apparatus corresponding to the neighboring fan to be cooled when flowing in a low temperature environment, and then cooled air enters the electronic device system through an air guiding apparatus corresponding to the faulty fan, so that not only a high temperature inside the electronic device system is not exacerbated, but also heat can be dissipated from the heat source, thereby facilitating heat dissipation of the heat source.

The foregoing descriptions are merely specific embodiments of this application, but are not intended to limit this application. Any modification, equivalent replacement, or improvement made without departing from the spirit and principle of this application should fall within the protection scope of this application.

What is claimed is:

1. An electronic device system, comprising:
a heat source;
a plurality of fans; and
a plurality of air guiding apparatuses, each air guiding apparatus having a plurality of air deflectors that are connected together and configured to be moved together in a same direction, wherein each air guiding apparatus is disposed behind a fan of the plurality of fans, wherein at least one air deflector of a respective air guiding apparatus disposed behind a respective fan is aligned directly behind the respective fan;
wherein the heat source is located on air inlet sides of the plurality of fans, and wherein the plurality of air guiding apparatuses are located on air outlet sides of the plurality of fans; and
wherein each air guiding apparatus of the plurality of air guiding apparatuses are configured to have, in response to at least one fan of the plurality of fans being a faulty fan, an air guiding direction of an air guiding apparatus corresponding to the faulty fan and an air guiding direction of an air guiding apparatus corresponding to a neighboring fan deviate from each other, wherein each angle of a plurality of angles is associated with a measurement of a temperature at the heat source corresponding to the faulty fan while air deflectors associated with the air guiding apparatus behind the faulty fan are at the respective angle, and wherein an angle of air deflectors associated with the air guiding apparatus behind the faulty fan is an angle selected from the plurality of angles and is set to an angle corresponding to a lowest temperature of temperatures of the plurality of angles.

2. The electronic device system according to claim 1, wherein an air guiding direction of each air guiding apparatus of the plurality of air guiding apparatuses is fixed, and wherein air guiding directions of air guiding apparatuses corresponding to two neighboring fans deviate from each other.

3. The electronic device system according to claim 1, wherein an air guiding direction of each air guiding apparatus of the plurality of air guiding apparatuses is adjustable.

4. The electronic device system according to claim 3, further comprising:
at least one adjustment motor; and
a control unit, configured to:
control, in response to detecting a faulty fan, by using the at least one adjustment motor, a first air guiding direction of an air guiding apparatus corresponding to the faulty fan and further control, in response to detecting the faulty fan, by using the at least one adjustment motor, a second air guiding direction of an air guiding apparatus corresponding to a neighboring fan to deviate from the first air guiding direction.

5. The electronic device system according to claim 4, wherein the control unit is configured to:

determine, in response to detecting the faulty fan, a target angle based on the lowest temperature of the heat source corresponding to the faulty fan; and
control, based on the target angle, by using the adjustment motor, the air guiding direction of the air guiding apparatus corresponding to the faulty fan and the air guiding direction of the air guiding apparatus corresponding to the neighboring fan to deviate from each other.

6. The electronic device system according to claim 1, wherein the plurality of air guiding apparatuses comprises a first air guiding apparatus and a second air guiding apparatus; and
wherein, in response to at least one fan of the plurality of fans being a faulty fan, an air guiding direction of the first air guiding apparatus is inclined at negative α degrees to a horizontal direction, and an air guiding direction of the second air guiding apparatus is inclined at positive β degrees to the horizontal direction, wherein both α and β are values ranging from 15 to 30.

7. The electronic device system according to claim 1, wherein the plurality of air guiding apparatuses comprises a first air guiding apparatus, a second air guiding apparatus, and a third air guiding apparatus;
wherein the second air guiding apparatus is located between the first air guiding apparatus and the third air guiding apparatus; and
wherein when there is a faulty fan, an air guiding direction of the first air guiding apparatus is inclined at negative α degrees to a horizontal direction in response to at least one fan of the plurality of fans being a faulty fan, wherein an air guiding direction of the second air guiding apparatus is parallel to the horizontal direction in response to the at least one fan of the plurality of fans being the faulty fan, and an air guiding direction of the third air guiding apparatus is inclined at positive β degrees to the horizontal direction in response to the at least one fan of the plurality of fans being the faulty fan, and wherein both α and β are values ranging from 30 to 60.

8. The electronic device system according to claim 1, wherein the plurality of air guiding apparatuses comprise a first air guiding apparatus, a second air guiding apparatus, a third air guiding apparatus, and a fourth air guiding apparatus;
wherein the first air guiding apparatus, the second air guiding apparatus, the third air guiding apparatus, and the fourth air guiding apparatus are sequentially arranged adjacent to each other;
wherein an air guiding direction of the first air guiding apparatus is inclined at negative α degrees to a horizontal direction in response to at least one fan of the plurality of fans being a faulty fan, wherein an air guiding direction of the second air guiding apparatus is inclined at negative β degrees to the horizontal direction in response to the at least one fan of the plurality of fans being the faulty fan, wherein α is a value ranging from 45 to 60, and wherein β is a value ranging from 15 to 30; and
wherein an air guiding direction of the third air guiding apparatus is inclined at positive γ degrees to the horizontal direction, wherein an air guiding direction of the fourth air guiding apparatus is inclined at positive δ degrees to the horizontal direction, wherein γ is a value ranging from 15 to 30, and wherein δ is a value ranging from 45 to 60.

9. The electronic device system according to claim 1, wherein the plurality of air guiding apparatuses are fastened on outer surfaces of housings of the plurality of fans.

10. The electronic device system according to claim 1, further comprising a cabinet;
wherein both the heat source and the plurality of fans are fastened to the cabinet; and
wherein each air guiding apparatus of the plurality of air guiding apparatuses is fastened on an outer surface of a wall of the cabinet.

11. The electronic device system according to claim 1, further comprising:
a cabinet; and
a rack;
wherein both the heat source and the plurality of fans are fastened to the cabinet;
wherein the cabinet is fastened to the rack; and
wherein each air guiding apparatus of the plurality of air guiding apparatuses is fastened on an outer surface of a door of the rack.

12. A method for manufacturing an electronic device system, comprising:
providing a plurality of fans and a plurality of air guiding apparatuses, wherein a heat source is located on air inlet sides of fans of the plurality of fans, and the plurality of air guiding apparatuses is located on air outlet sides of fans the plurality of fans, each air guiding apparatus having a plurality of air deflectors that are connected together and configured to be moved together in a same direction, wherein each air guiding apparatus is disposed behind a fan of the plurality of fans, wherein at least one air deflector of a respective air guiding apparatus disposed behind a respective fan is aligned directly behind the respective fan; and
wherein each air guiding apparatus of the plurality of air guiding apparatuses is configured to, in response to at least one fan of the plurality of fans being a faulty fan, set an air guiding direction of an air guiding apparatus corresponding to the faulty fan and an air guiding direction of an air guiding apparatus corresponding to a neighboring fan to deviate from each other, wherein each angle of a plurality of angles is associated with a measurement of a temperature at the heat source corresponding to the faulty fan while air deflectors associated with the air guiding apparatus behind the faulty fan are at the respective angle, and wherein an angle of air deflectors associated with the air guiding apparatus behind the faulty fan is an angle selected from the plurality of angles and is set to an angle corresponding to a lowest temperature of temperatures of the plurality of angles.

13. The method according to claim 12, wherein the providing the plurality of fans, and the plurality of air guiding apparatuses comprises:
installing the plurality of fans; and
installing the plurality of air guiding apparatuses on one or more outer surfaces of housings of the plurality of fans.

14. The method according to claim 12, wherein the electronic device system further comprises a cabinet; and
wherein the providing the plurality of fans, and the plurality of air guiding apparatuses comprises:
installing the plurality of fans in the cabinet; and
installing the plurality of air guiding apparatuses on an outer surface of a wall of the cabinet.

15. The method according to claim 12, wherein the electronic device system further comprises a cabinet and a rack; and
wherein the providing the plurality of fans, and the plurality of air guiding apparatuses comprises:
installing the plurality of fans in the cabinet;
installing the cabinet in the rack; and
installing the plurality of air guiding apparatuses on an outer surface of a door of the rack.

16. A method for controlling an electronic device system, comprising:
controlling, in response to at least one fan of a plurality of fans of an electronic device system being a faulty fan, a first air guiding direction of a first air guiding apparatus of the electronic device system, and further controlling a second air guiding direction of the second air guiding apparatus, wherein the electronic device system comprises the plurality of fans, and further comprises a plurality of air guiding apparatuses that comprises the first air guiding apparatus and a second air guiding apparatus, each air guiding apparatus of the plurality of air guiding apparatuses having a plurality of air deflectors that are connected together and configured to be moved together in a same direction, wherein each air guiding apparatus is disposed behind a fan of the plurality of fans, wherein at least one air deflector of a respective air guiding apparatus disposed behind a respective fan is aligned directly behind the respective fan, wherein the system has a heat source located on air inlet sides of the plurality of fans, and further has the plurality of air guiding apparatuses located on air outlet sides of the plurality of fans, wherein each air guiding apparatus of the plurality of air guiding apparatuses are adjustable;
wherein the first air guiding apparatus corresponds to the faulty fan and the second air guiding apparatus corresponds to a neighboring fan, and wherein controlling the first air guiding direction and the second air guiding direction comprises controlling the first air guiding direction and second air guiding direction to deviate from each other, wherein each angle of a plurality of angles is associated with a measurement of a temperature at the heat source corresponding to the faulty fan while air deflectors associated with the air guiding apparatus behind the faulty fan are at the respective angle, and wherein an angle of air deflectors associated with the air guiding apparatus of the first air guiding apparatus that is behind the faulty fan is an angle selected from the plurality of angles and is set to an angle corresponding to a lowest temperature of temperatures of the plurality of angles.

17. The method according to claim 16, wherein the controlling the first air guiding direction and the second air guiding direction to deviate from each other comprises:
determining, in response to detecting the faulty fan, a target angle based on the lowest temperature of the heat source corresponding to the faulty fan; and
controlling the first air guiding direction the second air guiding direction to deviate from each other based on the target angle.

18. The method according to claim 16, wherein the controlling the first air guiding direction the second air guiding direction comprises:
controlling, in response to detecting the faulty fan, by using at least one adjustment motor of the electronic device system, the first air guiding direction and the second air guiding direction deviate from each other.

19. The method according to claim 16, wherein the controlling the first air guiding direction and the second air guiding direction comprises:

controlling, in response to at least one fan of the plurality of fans being the faulty fan, the first air guiding direction to be inclined at first negative angle relative to a horizontal direction, and controlling the second air guiding direction to be inclined at positive angle to the horizontal direction.

20. The method according to claim 19, wherein the first negative angle and second positive angle are each angles with a magnitude ranging from 15 to 30.

\* \* \* \* \*